United States Patent [19]

Ohcoshi et al.

[11] Patent Number: 5,006,991
[45] Date of Patent: Apr. 9, 1991

[54] METHOD FOR MAKING OF DESIGN REFERENCE AND APPARATUS THEREFOR

[75] Inventors: Shigeru Ohcoshi, Takahagi; Toshiaki Yoshinaga, Hitachi, both of Japan

[73] Assignee: Hitachi, Ltd., Tokyo, Japan

[21] Appl. No.: 463,005

[22] Filed: Jan. 9, 1990

Related U.S. Application Data

[63] Continuation of Ser. No. 929,894, Nov. 13, 1986, abandoned.

[30] Foreign Application Priority Data

Nov. 14, 1985 [JP] Japan ................................. 60-253767

[51] Int. Cl.$^5$ ............................................. G06F 15/62
[52] U.S. Cl. ............................ 364/474.2; 364/474.26; 364/518; 364/512
[58] Field of Search ............... 364/518, 521, 191, 505, 364/512, 578, 580, 474.2, 474.24, 474.26, 474.32, 522; 340/725

[56] References Cited

U.S. PATENT DOCUMENTS

| | | | |
|---|---|---|---|
| 3,867,616 | 2/1975 | Korelitz et al. | 364/512 |
| 3,963,904 | 6/1976 | Blackwood et al. | 364/578 X |
| 4,504,918 | 3/1985 | Axmann | 340/725 X |
| 4,512,747 | 4/1985 | Hitchens et al. | 364/578 X |

*Primary Examiner*—Gary V. Harkcom
*Assistant Examiner*—Mark K. Zimmerman
*Attorney, Agent, or Firm*—Antonelli, Terry, Stout & Kraus

[57] ABSTRACT

Components of a design object are graphically displayed on a display device of an apparatus for making a design reference. A designated interference check element graphically displayed on the display device imitates an article or human being moving in an area in which an actual design object is arranged. The interference check element is graphically displayed in a predetermined moving area of the interference check element in the area in which the design object is arranged. An interference between the interference check element and the design object is detected while the interference check element and the design object are moved relative to each other such that the interference check element is moved along the moving area, and a detected interference is displayed on the display device.

22 Claims, 30 Drawing Sheets

FIG. 2

| EQUIPMENT CODE | BUILDING FLOOR CODE | AREA NUMBER | PATTERN | EQUIPMENT INSTALLATION LOCATION | EQUIPMENT ROTATION ANGLE |
|---|---|---|---|---|---|
| G11B0021 | R2B | 307 | 1 | 31032.0<br>59000.0 | 180.0 |

| NOZZLE NO., NOZZLE COORDINATE, COUPLING CODE, LINE CODE ||
|---|---|
| 1 | 0.0    280.0 |
| 2 | −2210.0    −280.0 |

FIG. 3

| DESIGN ATTACHMENT CODE | Xmin | Xmax | Ymin | Ymax |
|---|---|---|---|---|
| WL001 | 1000 | 5000 | 10000 | 11500 |
| WL002 | 6000 | 10000 | 10000 | 11500 |
| CL001 | 5000 | 6000 | 10000 | 11500 |

F I G. 4

| PAGE<br>MENU ITEM | 1 | 2 | 3 | 4 |
|---|---|---|---|---|
| MENU 1 | LPCS | DR | | |
| MENU 2 | HPCS | C | | |
| MENU 3 | HD | | | |
| MENU 4 | RHR | | | |
| MENU 5 | RCW | | | |
| MENU 6 | RD | | | |
| MENU 7 | SPS | | | |
| MENU 8 | RCIC | | | |
| MENU 9 | RHRC | | | |
| MENU 10 | MS | | | |
| MENU 11 | FW | | | |
| MENU 12 | CUW | | | |
| MENU 13 | HV | | | |

F I G. 5

| COORDINATE / MENU ITEM | Xmin | Xmax | Ymin | Ymax |
|---|---|---|---|---|
| MENU 1 | 0 | 150 | 200 | 250 |
| MENU 2 | 200 | 350 | 200 | 250 |
| MENU 3 | 400 | 550 | 200 | 250 |
| MENU 4 | 600 | 750 | 200 | 250 |
| MENU 5 | 800 | 950 | 200 | 250 |
| MENU 6 | 0 | 150 | 100 | 150 |
| MENU 7 | 200 | 350 | 100 | 150 |
| MENU 8 | 400 | 550 | 100 | 150 |
| MENU 9 | 600 | 750 | 100 | 150 |
| MENU 10 | 800 | 950 | 100 | 150 |
| MENU 11 | 0 | 150 | 0 | 50 |
| MENU 12 | 200 | 350 | 0 | 50 |
| MENU 13 | 400 | 550 | 0 | 50 |
| UPDATE | 600 | 750 | 0 | 50 |
| RETURN | 800 | 950 | 0 | 50 |

FIG. 6

| ITEM \ COORDINATE | X | Y |
|---|---|---|
| START POINT | 150 | 850 |
| END POINT | 850 | 850 |
| BRANCH POINT | — | 500 |

FIG. 7

| DESIGN OBJECT NAME | START POINT | INTERMEDIATE EQUIPMENT | | | END POINT |
|---|---|---|---|---|---|
| 600A-LPCS-3 | PUMP-3 | MO-11 | 100A-LPCS-37 | RE-7 | |
| | | AO-12 | 65A-LPCS-45 | FO15 | |
| | | | | | |
| | | | | | |
| | | | | | TANK-6 |
| | BRANCHING DESIGN OBJECT | END POINT | BRANCHING DESIGN OBJECT | END POINT | |
| | 100A-LPCS-37 | HX-1 | 65A-LPCS-45 | PUMP-4 | |
| | | | | | |
| | | | | | |
| | | | | | |
| | | | | | |

FIG. 8

| STANDARD PATTERN NUMBER | 1 | EQUIPMENT TYPE | TANK | STANDARD PATTERN NUMBER | 7 | EQUIPMENT TYPE | HEAT EX-CHANGER |
|---|---|---|---|---|---|---|---|
| | | | | | | | |
| H=500  $H_F$=20  N=200 <br> D=200  $D_F$=100 | | | | L=500  D=200  N=200 <br> M=50  P=100 | | | |
| STANDARD PATTERN NUMBER | 12 | EQUIPMENT TYPE | PUMP | STANDARD PATTERN NUMBER | 30 | EQUIPMENT TYPE | STRAINER |
| | | | | | | | |
| $L_F$ = 400    $D_F$ = 150 | | | | L = 200    D = 150 | | | |

F I G. 10
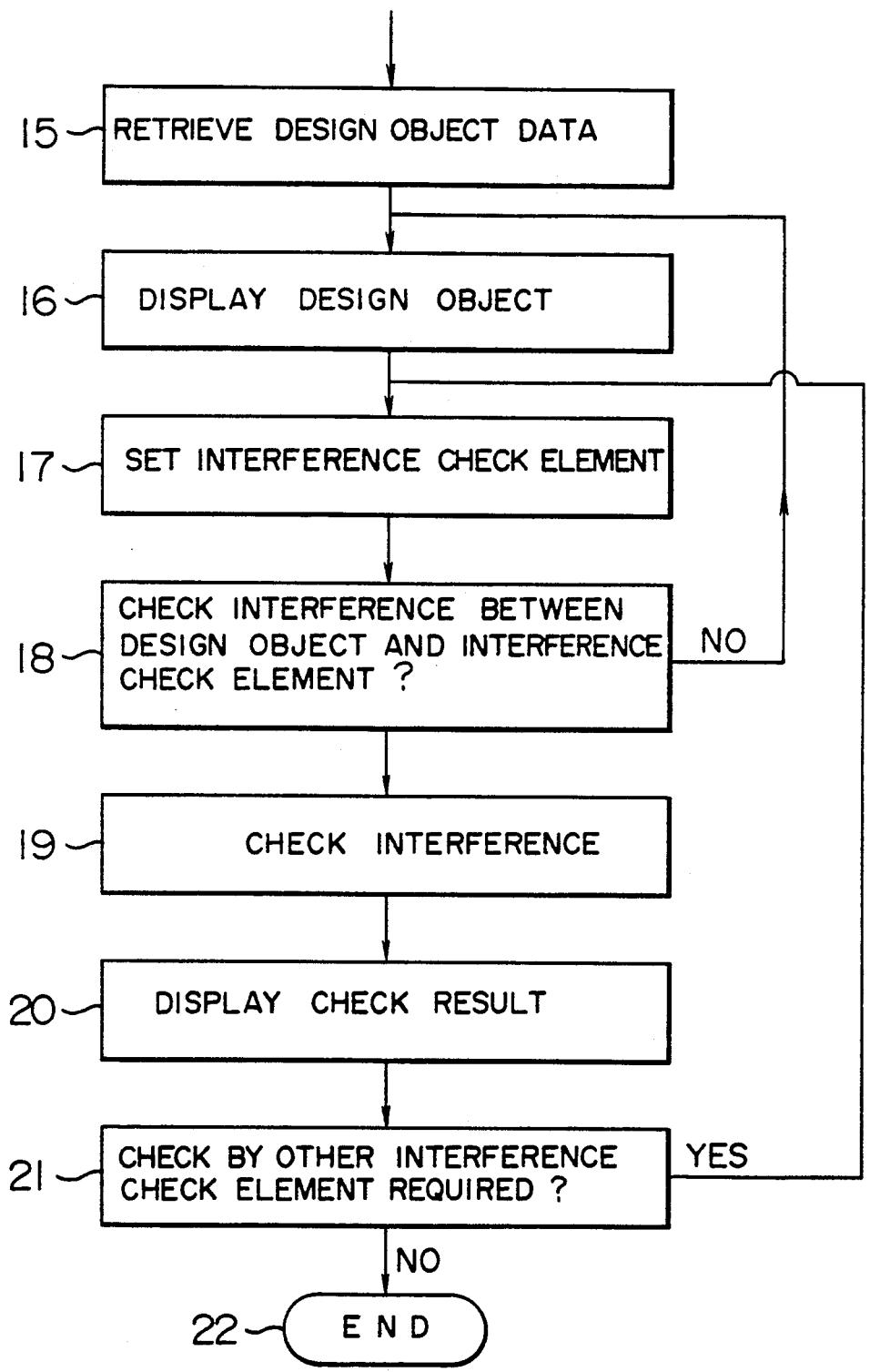

F I G. 14
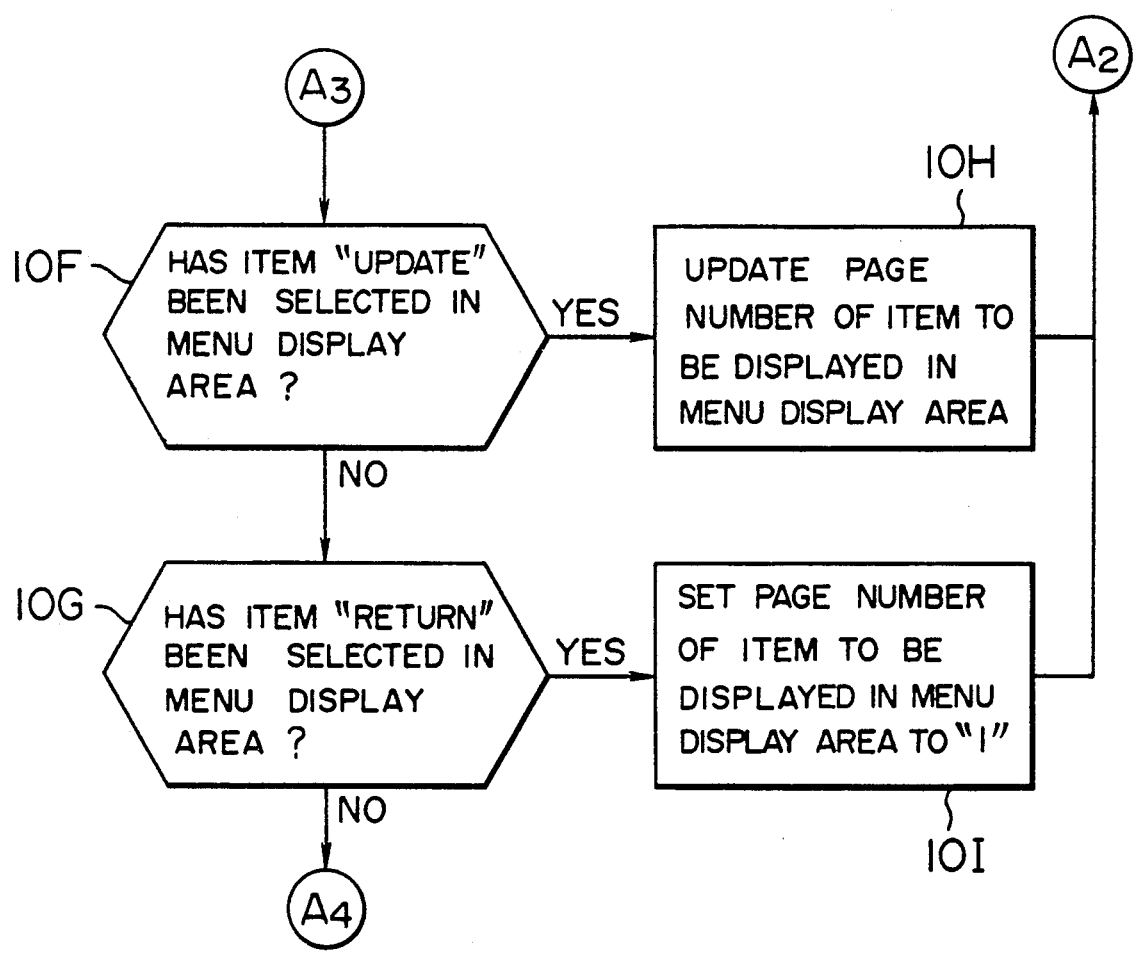

F I G. 15
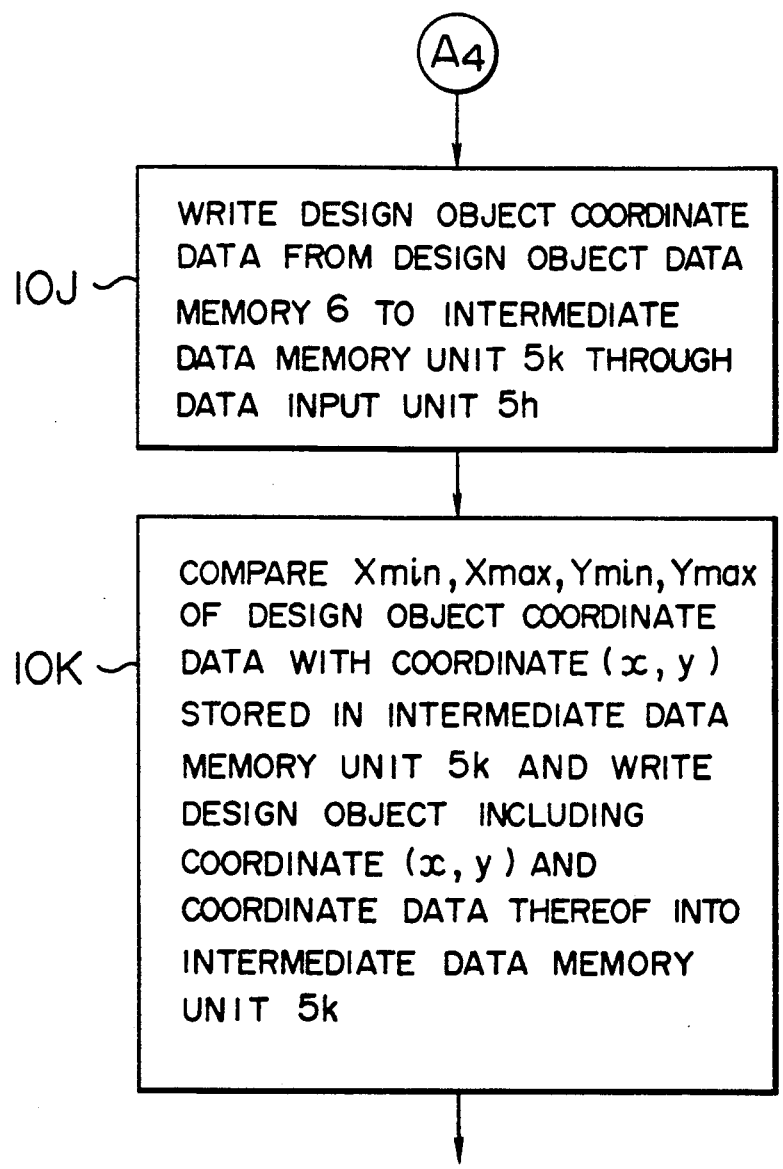

F I G. 20

| COORDINATE<br>COMPONENT | DISPLAY POSITION | | CHARACTER DISPLAY POSITION | | | |
|---|---|---|---|---|---|---|
| | X | Y | Xmin | Xmax | Ymin | Ymax |
| PUMP-3 | 150 | 850 | 125 | 175 | 700 | 750 |
| MO-11 | 250 | 850 | 225 | 275 | 750 | 800 |
| 100A-LPCS-37 | 350 | 850 | 375 | 425 | 650 | 700 |
| RE-7 | 450 | 850 | 425 | 475 | 750 | 800 |
| AO-12 | 550 | 850 | 525 | 575 | 750 | 800 |
| 65A-LPCS-45 | 650 | 850 | 675 | 725 | 650 | 700 |
| FO15 | 750 | 850 | 725 | 775 | 750 | 800 |
| TANK-6 | 850 | 850 | 825 | 875 | 700 | 750 |
| HX-1 | 350 | 500 | 325 | 375 | 350 | 400 |
| PUMP-4 | 650 | 500 | 625 | 675 | 350 | 400 |

| DISPLAY CONDITION | CONTENT |
|---|---|
| VIEW POINT | X=10000, Y=2500, Z=15000 |
| REFERENCE POINT | X=10000, Y=2500, Z=50000 |
| MAGNIFICATION | 0.8 |

F I G. 33
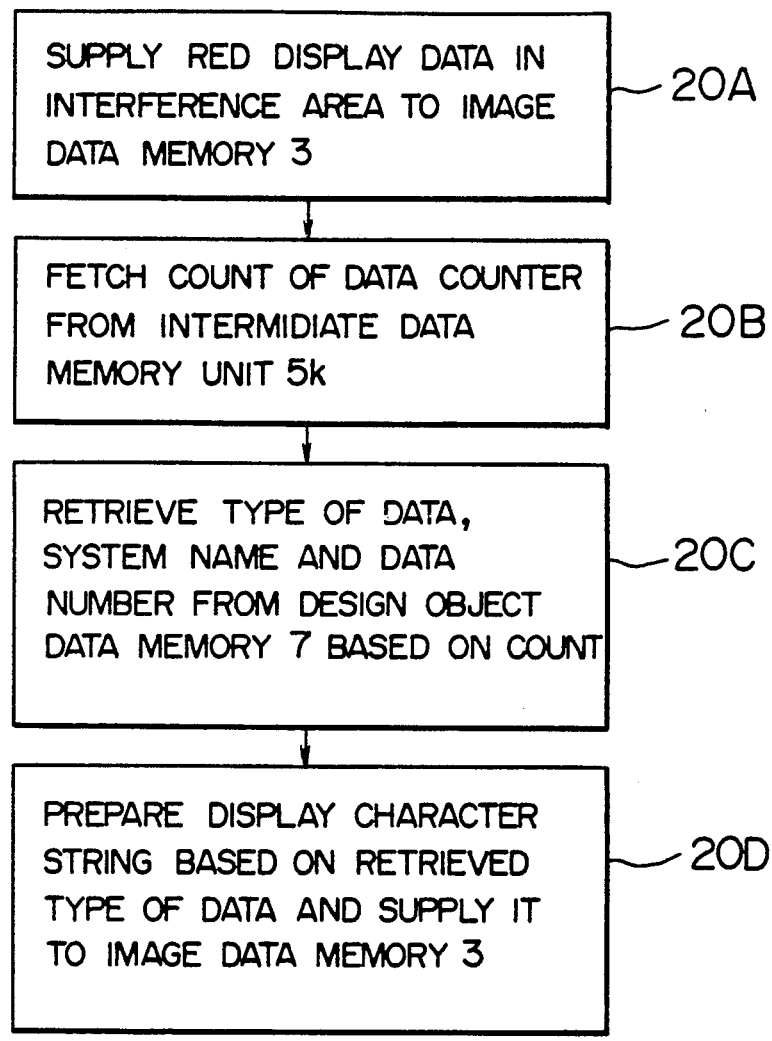
F I G. 34
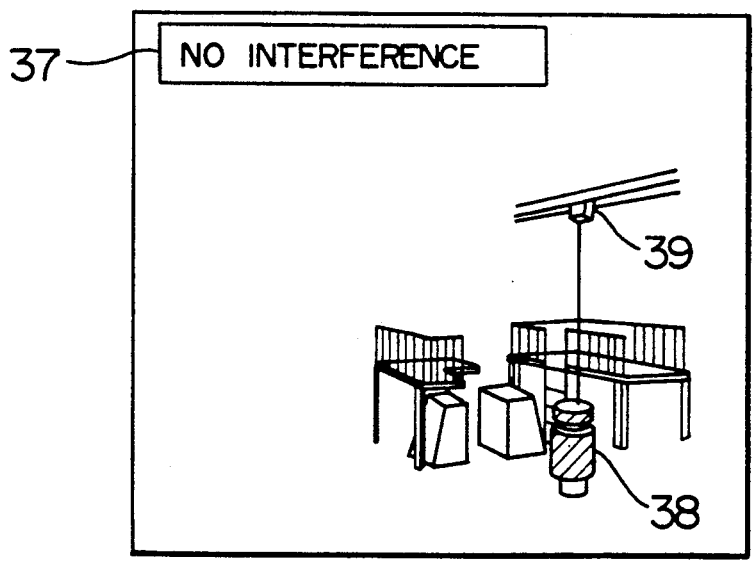

METHOD FOR MAKING OF DESIGN REFERENCE AND APPARATUS THEREFOR

This application is a continuation of application Ser. No. 929,894, filed Nov. 13, 1986 now abandoned.

BACKGROUND OF THE INVENTION

The present invention relates to a method for making a design reference and an apparatus therefor, and more particularly to a method for making a design reference and an apparatus therefor suitable for interactively and comparatively checking the validity of a layout plan of components of a design object.

An apparatus for making a design reference (hereafter referred to as a CAD apparatus) comprises a display screen on which a design object is to be displayed and an input device for generating coordinate data based on the designation of a point on the display screen in order to display a point, line or characters at the designated point and write a coordinate of that point and the displayed data into a memory by using an interactive technique. Such an apparatus is disclosed in the U.S. Pat. No. 4,451,895.

In the prior art CAD apparatus, data of a design object is converted to image data in order to display it on a display screen, and comparative checking of the design object is done by visually watching the data on the display. For example, in a CAD apparatus disclosed in Japanese Application JP-A-59-17382, scaled orthogonal lines are displayed on a display screen. An operator watches the orthogonal lines to visually measure a distance between two points on the screen. A CAD apparatus disclosed in Japanese Application JP-A-60-3791 recognizes a vector related to a point on a display screen which an operator picked.

SUMMARY OF THE INVENTION

It is an object of the present invention to provide a method for making a design reference and an apparatus therefor which permit efficient checking of necessary movement space being provided for a moving article or man in a design stage.

It is another object of the present invention to provide a method for making a design reference and an apparatus therefor for allowing efficient layout of a design object having complex connections.

The present invention is characterized by the steps of preparing first information for graphically displaying a structure of a designated design object based on selected data, preparing second information for graphically displaying a designated interference check element which simulates an article or a man moving in an area in which a real design object is to be installed, and displaying patterns of the design object and the interference check element based on the first and second information.

The interference check element moves or need to be moved in an area in which a real machine (manufactured real machine of a design object) is to be installed, or in the real unit, and it simulates the movement in the area of the real, unit installation or in the real unit in order to check the presence or absence of interference with a component of the real unit movement in the area of the real unit installation.

BRIEF DESCRIPTION OF THE DRAWINGS

FIG. 2 shows a coordinate data of a design attachment stored in a design attachment data memory, FIG. 3 shows another example of the coordinate data of the design attachment stored in the design attachment data memory, FIGS. 4, 5, 6 and 7 show name data of the design object corresponding to a menu item stored in a design object data memory, coordinate data of the design object corresponding to the menu item, coordinate data of start point, end point and branch point of the design object, and data of connections of components of the design object, respectively, FIG. 8 shows shape data of standard patterns of the components of the design object stored in a standard pattern shape data memory, FIGS. 9 and 10 show processes carried out in the apparatus for making of design reference shown in FIG. 1, FIG. 13, 14 and 15 show details of a flowchart of a step 10 of FIG. 9, FIG. 20 shows a data storage format of display positions of components representing connectivity of the design object, FIG. 33 shows the details of a flowchart of a step 20 of FIG. 10, and FIGS. 34, 35 and 36 show images of interference checks by different interference check element.

DESCRIPTION OF THE PREFERRED EMBODIMENTS

Embodiments of the apparatus for making of design reference in accordance with the present invention will now be specifically explained.

Figure 1:
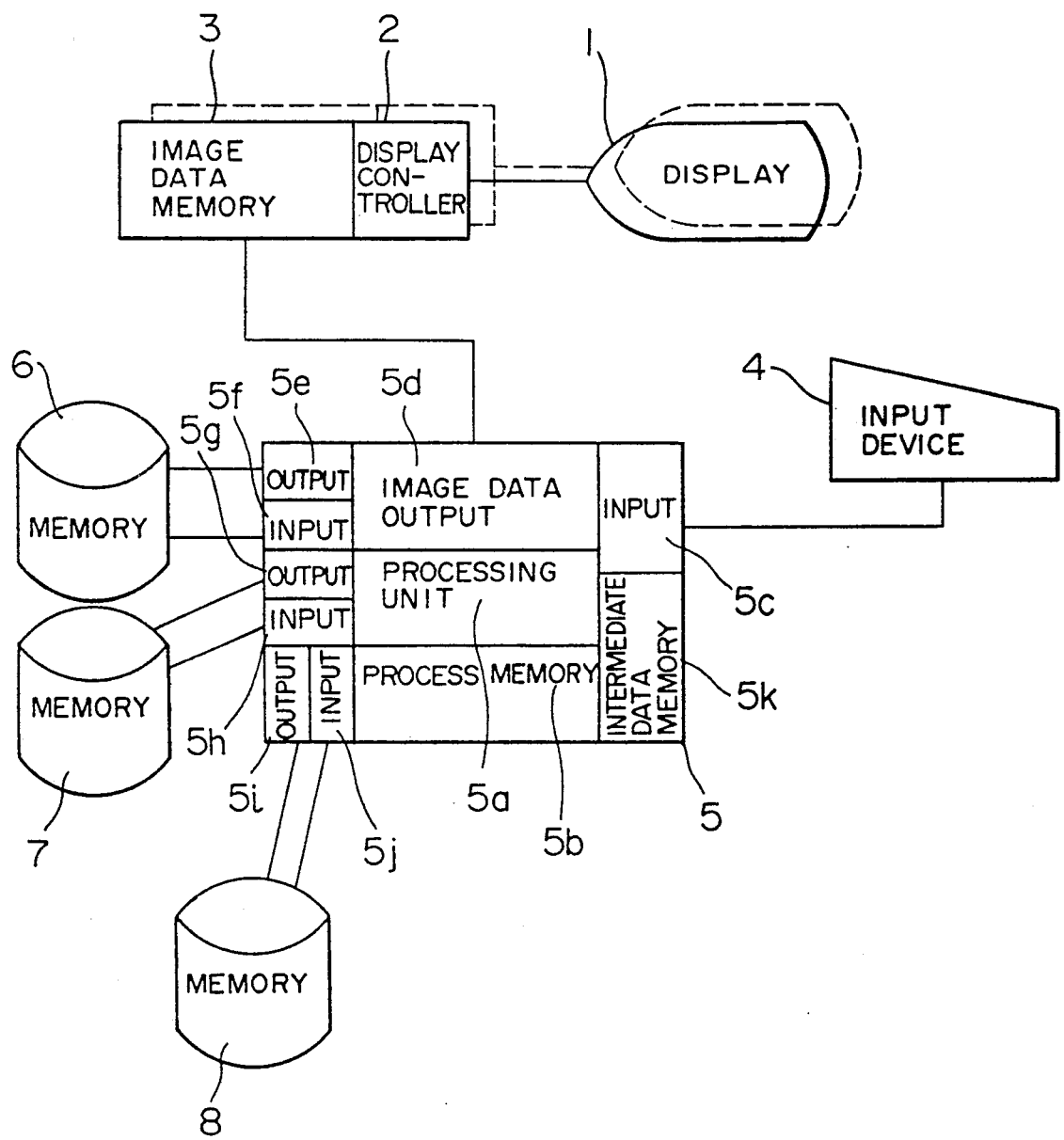
FIG. 1 shows a configuration of one embodiment of an apparatus for making a design reference in accordance with the present invention.

FIG. 1 shows a configuration of one embodiment of the apparatus for making a design reference of the present invention. A processor 5 comprises a processing unit 5a, a process memory unit 5b, an input unit 5c, an image data output unit 5d, a retrieval code output unit 5e, a design attachment data input unit 5f, a retrieval code output unit 5g, a design object data input unit 5h, a standard equipment pattern data retrieval code output unit 5i, a standard equipment pattern data input unit 5j, and an intermediate data memory unit 5k. The process stored in the process memory unit 5b is serially fetched to the processing unit 5a for execution. An image data memory unit 3 stores coordinate data of design attachment which is image data supplied from the processor 5, and coordinate data of a display area for design object connections. An image display controller 2 fetches coordinate data of an image to be displayed from the image data memory 3 and displays the characters and image on a display device 1.

FIG. 2 shows an example of the coordinate data of the design attachment stored in a design attachment data memory 6. The design attachment means equipment which are related to design object area in which the design object is to be installed. The coordinate data of FIG. 2 shows a standard equipment pattern of a design attachment (equipment) G11B0021, an installation position (X, Y) thereof, a rotation angle and coordinates (X, Y) of a nozzle which are start and end points of the design object.

FIG. 3 shows coordinate data of a design attachment stored in another pattern in the design attachment data memory 6. The coordinate data of FIG. 3 shows maximum and minimum values of X and Y coordinates of a design attachment, for example, WL 001 (see items Xmax, Xmin, Ymax and Ymin).

A design object data memory 7 stores data of a design object corresponding to a menu item shown in FIG. 4 and coordinate data of menu items shown in FIG. 5, that is, the design object. The design object data memory 7 further stores start point and end point coordinates of the design object, a coordinate of a branch end point of a branch line (see FIG. 6), and data of connections of components of the design object (see FIG. 7).

A standard pattern shape data memory 8 stores standard pattern shape data of the components of the design object, as shown in FIG. 8.

An operator enters a code of a design object area in which the design object is to be located, from the input device 4 such as a keyboard. The code of the design object area is supplied to the processing unit 5a from the input unit 5c. The processing unit 5a receives the code of the design object area and fetches the process (computer program shown in FIGS. 9 and 10) stored in the process memory 5b and sequentially carries out the process in accordance with the computer program. The first step fetched is a step shown in FIG. 9. After this step, the design object is entered so that a step of FIG. 10 is fetched and executed.

The operation of the apparatus for making a design reference of the present embodiment is explained for each step.

Figure 11:
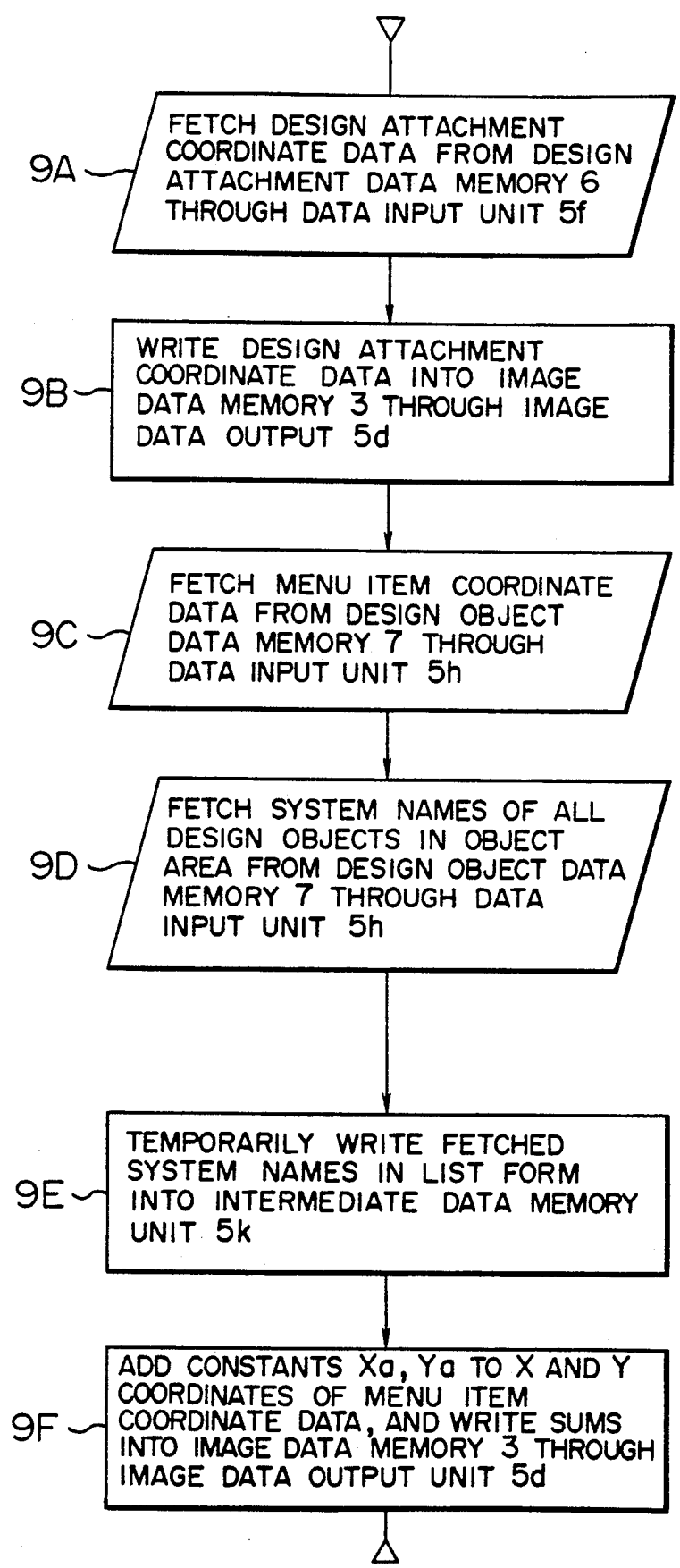
FIG. 11 shows the detail of a flowchart of a step 9 of FIG. 9.

A step 9 is first executed. FIG. 11 shows the details of step 9. In a step 9A, a code of a design object area, for example, a building floor code entered by the processing unit 5a is sent to the design attachment data memory 6 through the retrieval code output unit 5e, and coordinate data of a corresponding design attachment is retrieved from the design attachment data memory 6 and stored in the intermediate data memory 5k through the data input unit 5f. If the design attachment is an equipment, an equipment pattern number is further sent to the standard equipment pattern data memory 8 through the retrieval code output unit 5i and corresponding equipment pattern data is stored in the intermediate data memory 5k.

The coordinate data of the design attachment retrieved and stored in the intermediate data memory 5k in the step 9A is supplied to the image data memory 3 through the image data output unit 5d (step 9B).

The coordinate data of the menu items related to the input design object area are retrieved from the design object data memory 7 and stored in the intermediate data memory 5k through the data input unit 5h (step 9C). Thus, the coordinate data corresponding to the menu items shown in FIG. 5 are stored in the intermediate data memory 5k.

In a step 9D, the building floor code which indicates the area in which the input design object is to be located is sent to the design object data memory 7 through the retrieval code output unit 5g, and the system name data of the design object having that code is supplied to the processing unit 5a through the data input unit 5h. The system name data entered in the step 9D is stored in the intermediate data memory unit 5k (step 9E). The system name data shown in FIG. 4 is stored in the intermediate data memory 5k in the step 9E.

In a step 9F, system names "LPCS", "HPCS", "HD", "RHR", "RCW", "RD", "SPS", "RCIC", "RHRC", "MS", "FW", "CUW" and "HV" corresponding to the menu items on page 1, that is, menus 1 to 13 are fetched from the data in the list form which is shown in FIG. 4 and which is stored in the intermediate data memory 5k, and they are supplied to the image data memory 3 together with the coordinate data of the menu items shown in FIG. 5. In the step 9F, of the menu items shown in FIG. 5, the items "UPDATE" and "RETURN" are indicated by characters and they are supplied to the image data memory 3.

Figure 12:
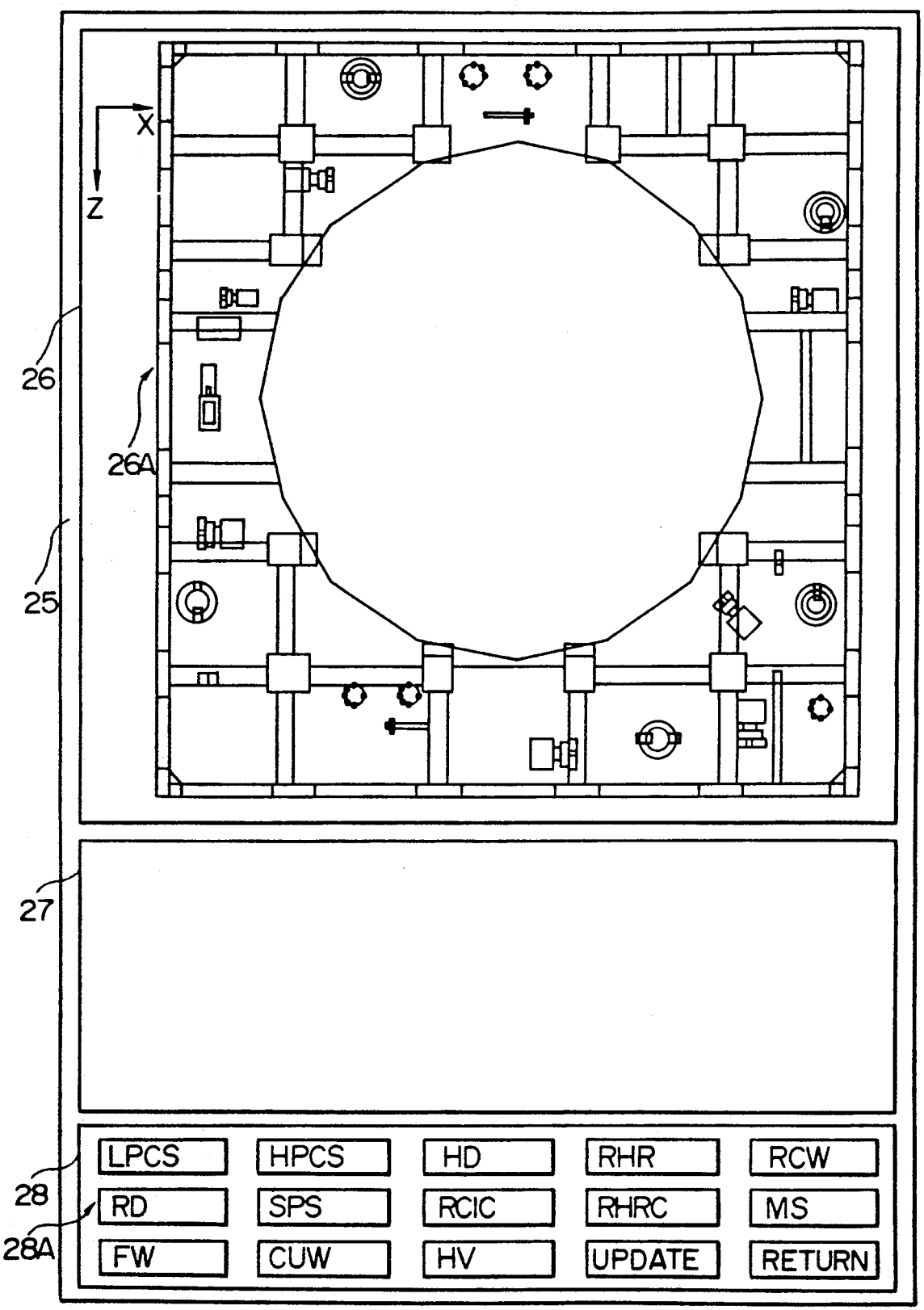
FIG. 12 shows an image displayed on a display device at the end of the step 9.

After the step 9F, an image based on the data of the design attachment and the menu items stored in the image data memory 3 is displayed on the display device 1 by the image display controller 2. FIG. 12 shows an example of the image displayed on the display device 1 after the step 9. In the example shown in FIG. 12, the screen 25 of the display device 1 is divided into a design attachment display area 26, a design object connections chart display area 27 and a menu display area 28, and a design attachment image 26A, a connections image 27A (shown in FIGS. 22 and 24) and a menu item image 28A are displayed in the respective areas. Two display devices 1 may be used so that the image in the display area 26 is displayed on one of the display devices 1 and the images in the display areas 27 and 28 are displayed on the other display device 1. An origin point (Xmin, Ymin) of the image 28A is defined in the step 9 at a point displaced from an origin point of the screen 25 by Xa and Ya.

In the step 10 of the present embodiment, the coordinate displayed on the screen 25 of the display device 1 is entered by the input device 4, and the design object name corresponding to the coordinate is selected from the design object data memory 7.

Figure 13:
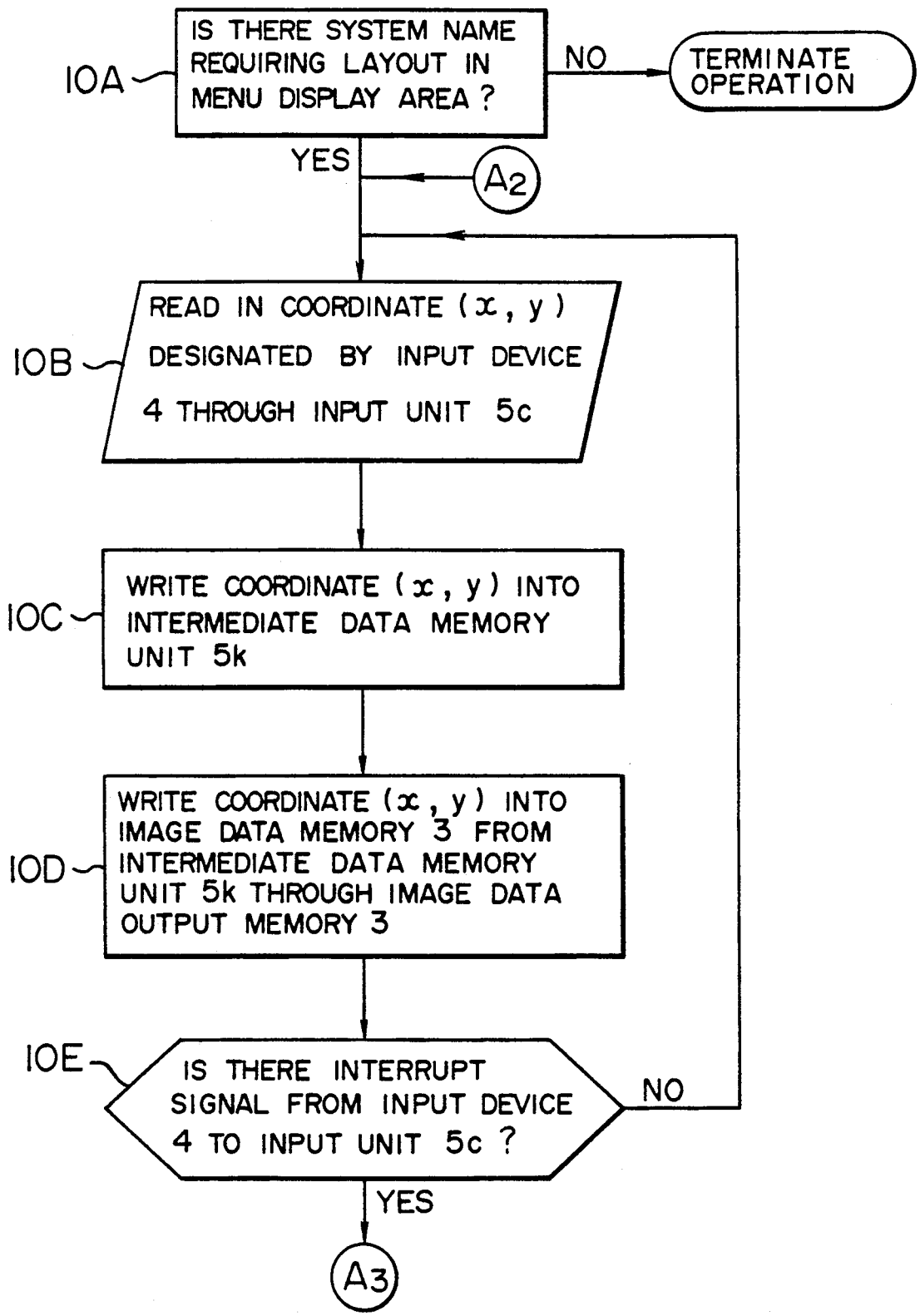

FIG. 13 shows steps 10A-10E of the step 10. Prior to a step 10B, if it is determined in a step 10A that there is no system name to be laid out in the image 28A displayed in the menu item display area 28, the subsequent step is not carried out and the operation is terminated. If it is determined that there is a system name to be laid out, the steps 10B-10E are carried out. In the steps 10B-10E, designation must be performed by the input device 4. Accordingly, until an interrupt signal is supplied to the processor 5 from the input device 4 through the input unit 5c, a designation point is displayed on the screen 25 of the display device 1 corresponding to a designation coordinate.

FIG. 14 shows steps 10F-10I of the step 10. If "UPDATE" or "RETURN" is not selected, the decisions in the steps 10F and 10I are "NO" and the process goes to steps 10J and 10K shown in FIG. 15. When "UPDATE" or "RETURN" in the menu display area 28 of the screen of FIG. 12 is selected, step 10H or 10I is carried out.

The steps 10A-10H are specifically explained. Referring to FIG. 12, the designation by the input device 4 on the screen 25 of the display device 1 and, the change of display are explained. For example, a pointer (cursor) displayed on the image 28A of the menu display area 28 is aligned to the menu item "LPCS" by the input device 4. Thus, a coordinate (x, y) of the pointer on the screen 25 is read into the processing unit 5a through the input unit 5c (step 10B) and written into the intermediate data memory unit 5k (step 10C). The coordinate (x, y) is further written into the image data memory 3 through the image data output unit 5d (step 10D). When an interrupt signal is sent from the input device 4 to the processor 5 (step 10E), the steps 10J and 10K are carried out if the decisions in the steps 10F and 10G are "NO" and the system name "LPCS" is supplied to and stored in the intermediate data memory unit 5k. In FIG. 12, if there is no system name to be selected by an operator in the system names corresponding to the menus 1 to 13, "UPDATE" is selected in a step 10F and the image 28A in the menu display area 28 is re-displayed page by page as shown in FIG. 4. The updating a page may be done in the following manner. The pointer (cursor) displayed in the menu display area is aligned to the menu item "UPDATE" by the input device 4 and an interrupt signal is sent from the input device 4 to the processor 5 so that the page number for the system name corresponding to the menu item shown in FIG. 12 is incremented by one. For example, when "UPDATE" in the menu display area 28 on the screen shown in FIG. 12 is designated by the input device 4, a step 10H is carried out and the image 28A in the menu display area 28 changes to that shown on page 2 of FIG. 4.

In a step 10J, based on the coordinate of the menu item of the image 28A on the display device 1 inputted in the step 10B and stored in the intermediate data memory 5k, the menu item corresponding to the above coordinate and the coordinate data of the menu item (Xmax, Ymax, Xmin and Ymin, see FIG. 5) are selected from the design object data memory 7 and they are stored in the intermediate data memory unit 5k through the data input unit 5h. Then, in a step 10K, a system name whose coordinate (x, y) of the menu item on the image 28A stored in the intermediate data memory unit 5k in the step 10C meets formulas (1) and (2) for the coordinate data of the menu item stored in the intermediate data memory unit 5k in the step 10J is selected from the intermediate data memory unit 5k.

$$Xmin \leq x \leq Xmax \qquad (1)$$

$$Ymin \leq y \leq Ymax \qquad (2)$$

where Xmin is a value in the item "coordinate Data Xmin" of the menu items shown in FIG. 5, Xmax is a value in the item "Coordinate Data Xmax" of the menu items shown in FIG. 5, Ymin is a value of the item "Coordinate Data Ymin" of the menu items shown in FIG. 5, and Ymax is a value of the item "Coordinate Data Ymax" of the menu items shown in FIG. 5.

In the present embodiment, if the coordinate entered in the step 10B is (X=100, y=230), the menu item "MENU 1" which has $$Xmin=0, Xmax=150$$

$$Ymin=200, Ymax=250$$

in the coordinate data (stored in the design object data memory 7) of the menu items shown in FIG. 5 meets the conditions of the formulas (1) and 2). In the steps 10F-10I, when the page number "1" is selected, the selected menu item name is "LPCS". The menu item "LPCS" selected in the step 10K is temporarily stored in the intermediate data memory unit 5k.

In the step 11 and the following steps, it is assumed that the menu item is stored in the intermediate data memory unit 5k.

Figure 16:
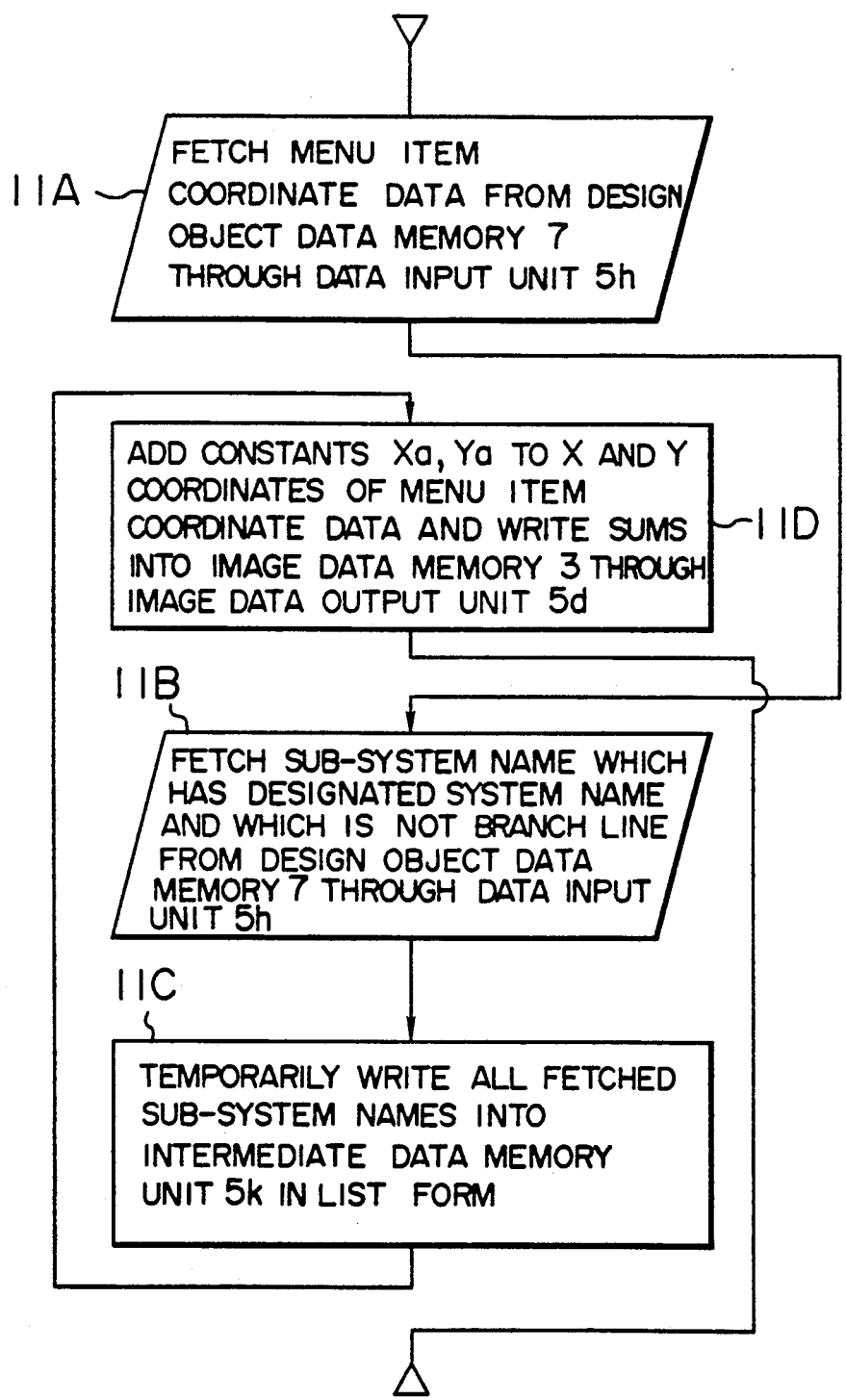
FIG. 16 shows the details of a flowchart of a step 11 of FIG. 9.

The step 11 is then carried out. FIG. 16 show the details of the step 11. Steps 11A and 11B shown in FIG. 16 are identical to the steps 9C and 9D described above. IN the step 11B, the menu item (system name) stored in the intermediate data memory unit 5k in the step 10 is sent to the design object data memory 7 through the data retrieval code output unit 5g, and a name (sub-system name) of the design object which has that menu item (system name) and which is not a branch line (branch system) is retrieved from the design object data memory 7 and supplies the retrieved design object name. All the sub-system names entered in the step 11B is sorted in the intermediate data memory unit 5k (step 11C).

Figure 17:
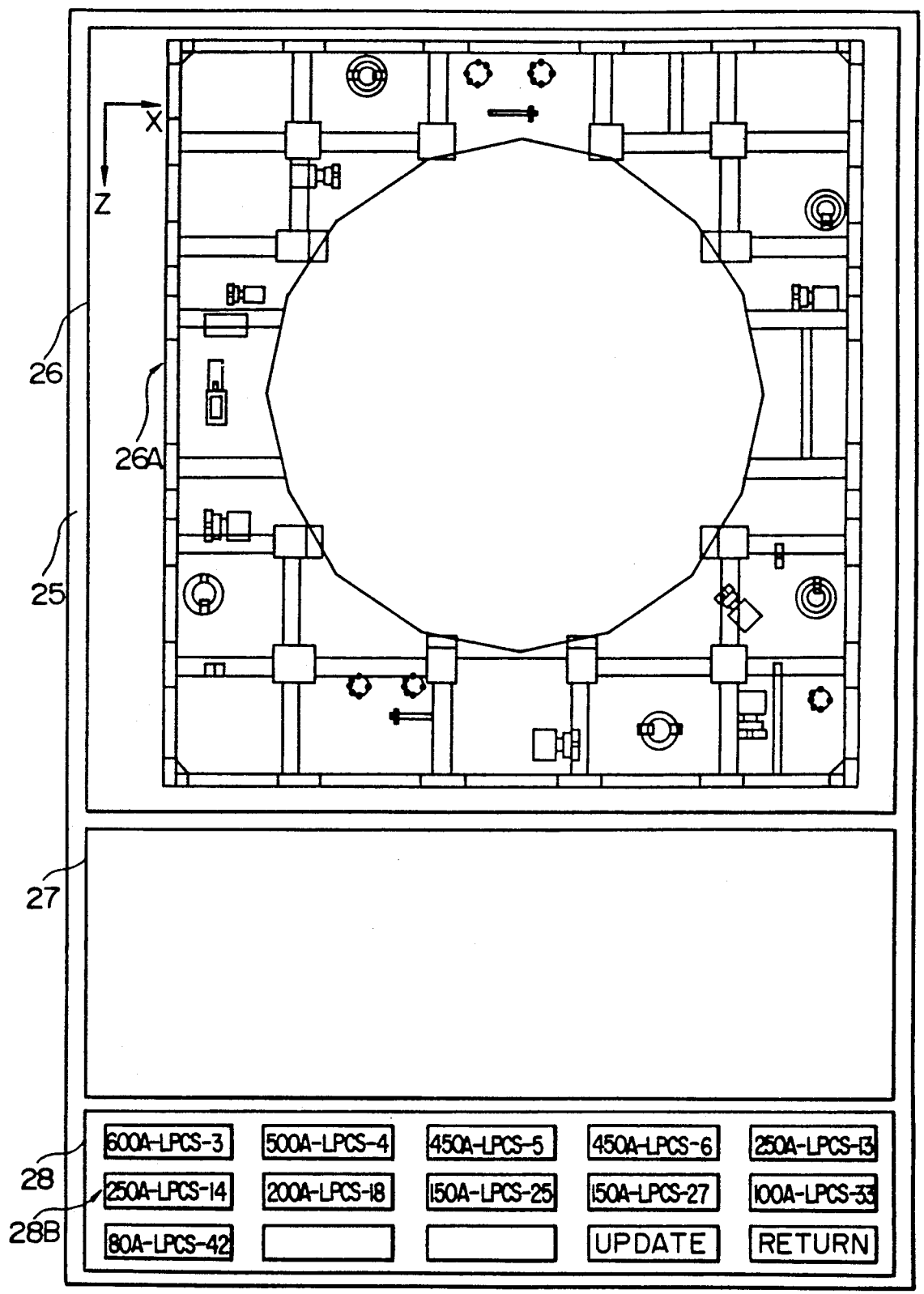
FIG. 17 shows an image displayed on the display device at the end of the step 11.

In a step 11D, the menu items stored in the intermediate data memory unit 5k in the step 11C are displayed in the corresponding areas on the screen 25, in the same manner as that in the step 9F. An example of the image displayed in the menu display area 28 of the display device 1 is shown in FIG. 17. The image 28B displayed in the menu display area 28 indicates all sub-system items concerning the menu item "LPCS".

The step 12 of the present embodiment is now explained. The step 12 comprises the steps 10A-10K like the step 10 described above. In the step 12, however, the "System Name" in the step 10A of the step 10 is changed to "Sub-System Name". In the changed step 1-A, if it is determined that there is no system name to be laid out, the image at the end of the step 9 is displayed (FIG. 12). In the step 12, if the menu item "RETURN" is designated when the page 1 of the menu content is displayed on the menu display area 28, the image at the end of the step 9 (FIG. 12) is displayed on the screen 25.

Assuming that the menu item (sub-system name) "600A-LPCS-3" is selected in the step 12 and stored in the intermediate data memory unit 5k, the steps 13 and 14 are explained with reference to the layout of the sub-system "600A-LPCS-3".

Figure 18:
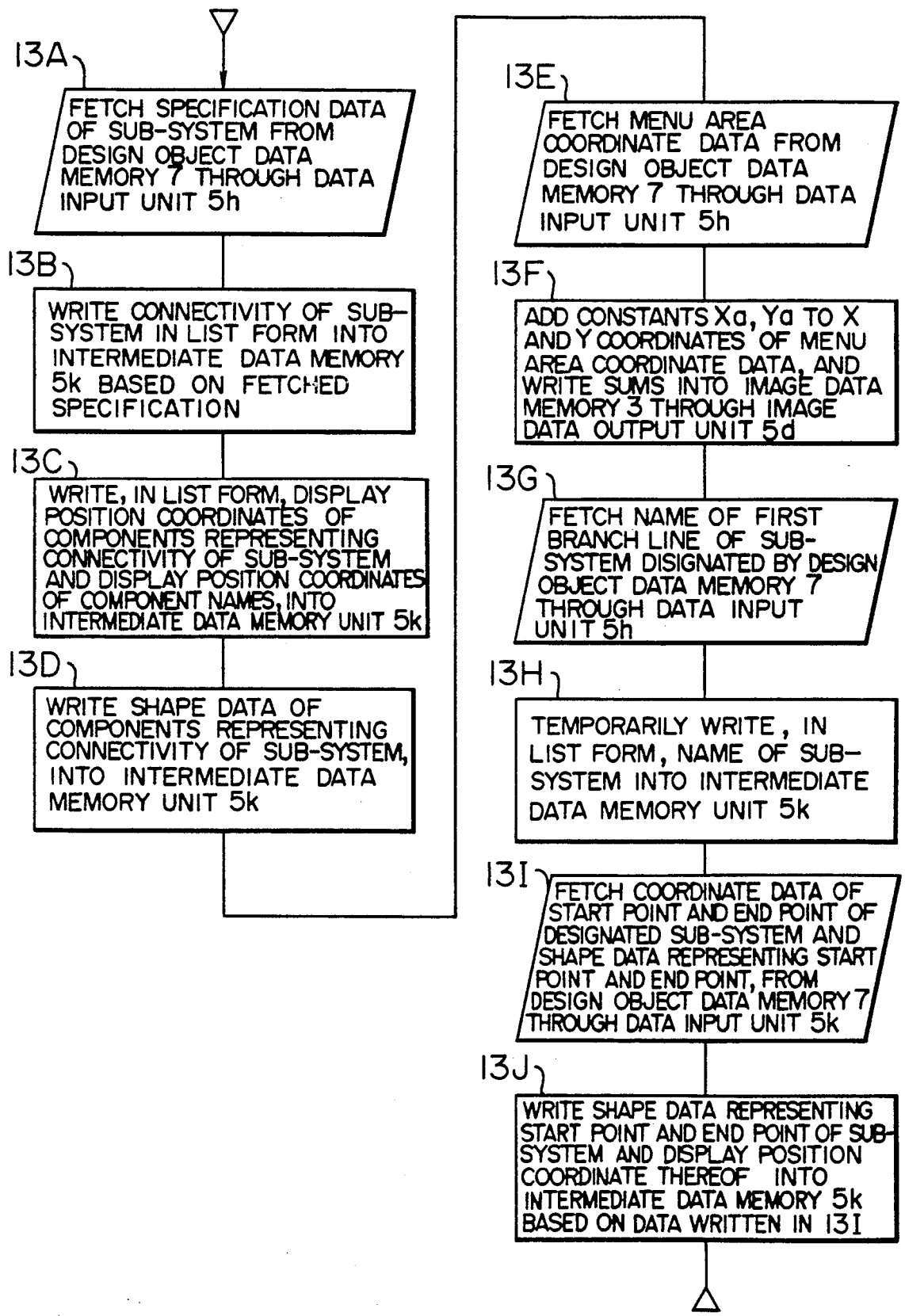
FIG. 18 shows the details of a flowchart of a step 13 of FIG. 9.

The step 13 is first carried out as follows. FIG. 18 show the details of step 13. In steps 13A and 13B, the sub-system name temporarily stored in the intermediate data memory unit 5k in the step 12 is sent to the design object data memory 7 through the retrieval code output 5g, and a data representing connections with the corresponding sub-system is retrieved from the specification data of the sub-system stored in the design object data memory 7 and temporarily stored in the intermediate data memory unit 5k. Thus, the data representing the sub-system connection shown in FIG. 7 is stored in the intermediate data memory unit 5k.

Figure 19:
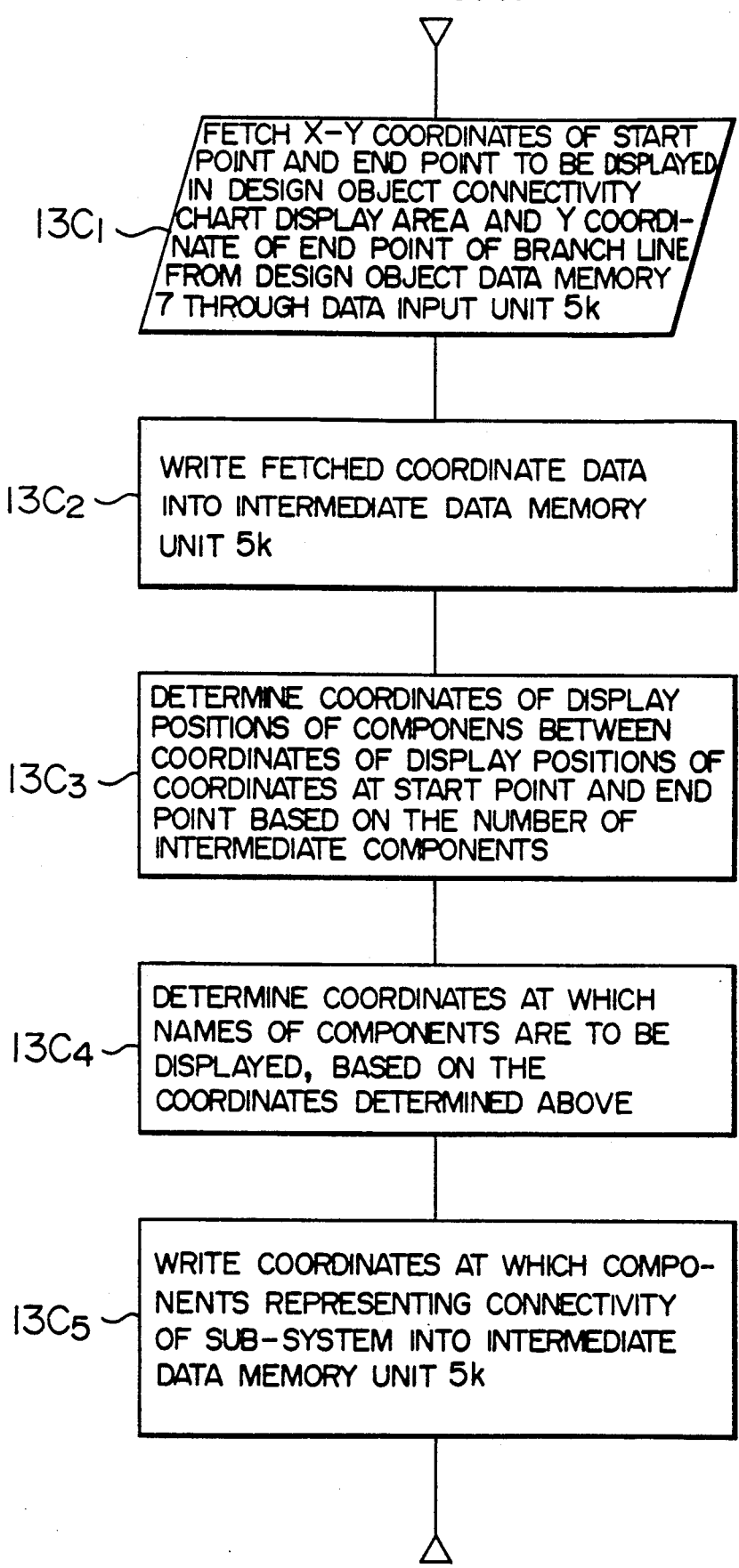
FIG. 19 shows the details of a flowchart of a step 13C of FIG. 18.

In a step 13C, display position coordinates of the components of the sub-system stored in the intermediate data memory unit 5k and display position coordinates of the names of the components are determined in order to display the shapes of the components of the sub-system in the design object connection chart display area 27 on the display device 1 based on the connection of the sub-system stored in the intermediate data memory unit 5k, and those coordinates are written into the intermediate data memory unit 5k. FIG. 19 shows a detailed process flowchart of the step 13C. In steps $13C_1$ and $13C_2$, coordinates of a start point and an end point of the sub-system and a Y coordinate of an end point element of a branch line for displaying the components in the design object connection chart display area 27 are retrieved from the design object data memory 7 based on the corresponding sub-system, and they are read into the processing unit 5a through the data input unit 5h. Then, the coordinate data is stored in the intermediate data memory unit 5k. Thus, the coordinate data shown in FIG. 6 is stored in the design object data memory 7. In a step $13C_3$, the distance between the start point and the end point is equi-divided based on the coordinates to be used as start points and end points of the components of the sub-system stored in the intermediate data memory unit 5k and the number of components excluding the start points and the end points retrievable from the data in the list form shown in FIG. 7, and the display position coordinates of the components are allocated in the order of the components. The display position for the end point of the branch line is determined by the given Y coordinate and the X coordinate determined in the manner described above. In the sub-system "600A-LPCS-3", ad seen from FIGS. 6 and 7, Xmin (X coordinate of start point)=150
Xmax (X coordinate of end point)=850
Number of component excluding start and end points (and excluding branch end point)=6
Accordingly, (850−150)/(6+1)=100. Thus, the components of the sub-system "600A-LPCS-3" are arranged at an interval of 100. In a step $13C_4$, character display position coordinates for displaying names of the components are determined based on the display position coordinates of the components. In a step $13C_5$, the display position coordinates for displaying the components representing the connections of the sub-system and the display position coordinates for displaying the names of the components are written into the intermediate data memory unit 5k. FIG. 20 shows the display position coordinates of the components and the names stored in the intermediate data memory unit 5k in the step $13C_5$.

Figure 21:
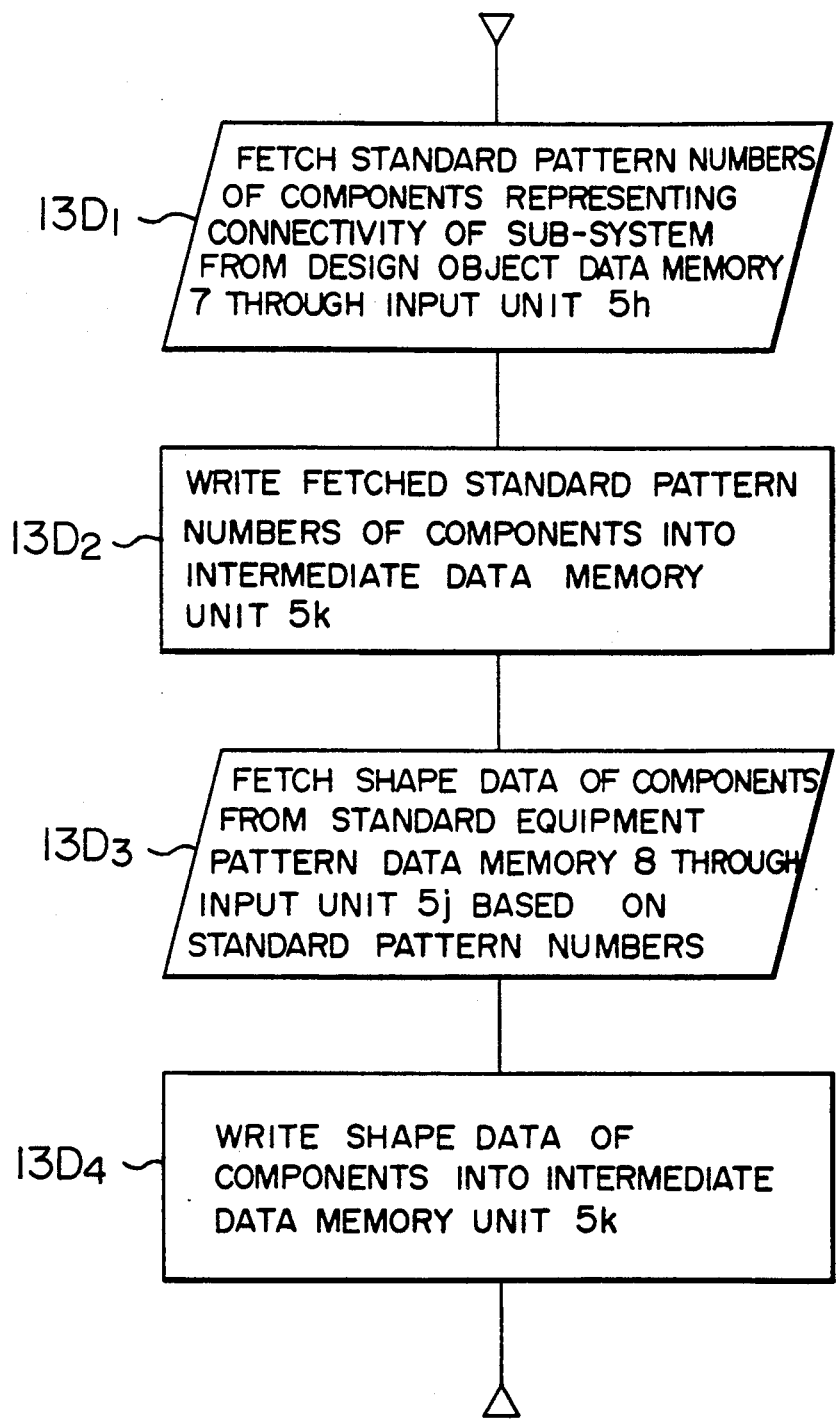
FIG. 21 shows the details of a flowchart of a step 13D of FIG. 18.

In a step 13D, shape data of the components of the sub-system (for example, 600A-LPCS-3) are stored in the intermediate data memory unit 5k. The step 13D comprises steps $13D_1$–$13D_4$ as shown in FIG. 21. In a step $13D_1$, the names of the components (excluding the branch) stored in the intermediate data memory unit 5k and shown in FIG. 20 are sent to the design object data memory 7 through the retrieval code output unit 5g, and the standard pattern numbers of the components are read from the sub-system specification data through the input unit 5h. In a step $13D_2$, the standard pattern numbers are written into the intermediate data memory unit 5k. In a step $13D_3$, the standard pattern numbers stored in the intermediate data memory unit 5k are sent to the standard equipment pattern data memory 8 through the retrieval code output unit 5i to retrieve the equipments having the corresponding standard pattern numbers and the shape data of the standard equipment patterns related to the equipment are read into the processor 5 through the data input unit 5j. In a step $13D_4$, the shape data is stored in the intermediate data memory unit 5k. The shape data shown in FIG. 8 is stored in the intermediate data memory unit 5k in the step $13D_4$. As described above, the display position coordinates of the components representing the connections of the sub-system "600A-LPCS-3" and the names thereof stored in the intermediate data memory unit 5k, and the shape data of the components are related to each other, and supplied to the image data memory 3 through the image data output unit 5d. This is carried out after the step $13D_4$ as a part of the step 13D although it is not shown, the coordinate data stored in the image data memory 3 in the above step is read into the image display controller 2 and displayed in the design object connection chart display area 27 of the display device 1 as the image 27A (FIG. 22).

In steps 13E–13H, the sub-system name temporarily stored in the intermediate data memory 5k in the step 12 is sent to the design object data memory 7 through the retrieval code output unit 5g to retrieve the specification data of the corresponding sub-system, a name of a first branch line (branch system) which directly branches from sub-system is stored into the intermediate data memory unit 5k through the data input unit 5h. The steps 13E–13H are identical to the steps 11A–11D. The name of the first branch line stored in the intermediate data memory unit 5k in the step 13H is supplied to the image data memory 3 and displayed as a menu item in the menu display area 28 of the display device 1. The image 28C in the menu display area 28 is displayed in FIG. 22.

Figure 22:
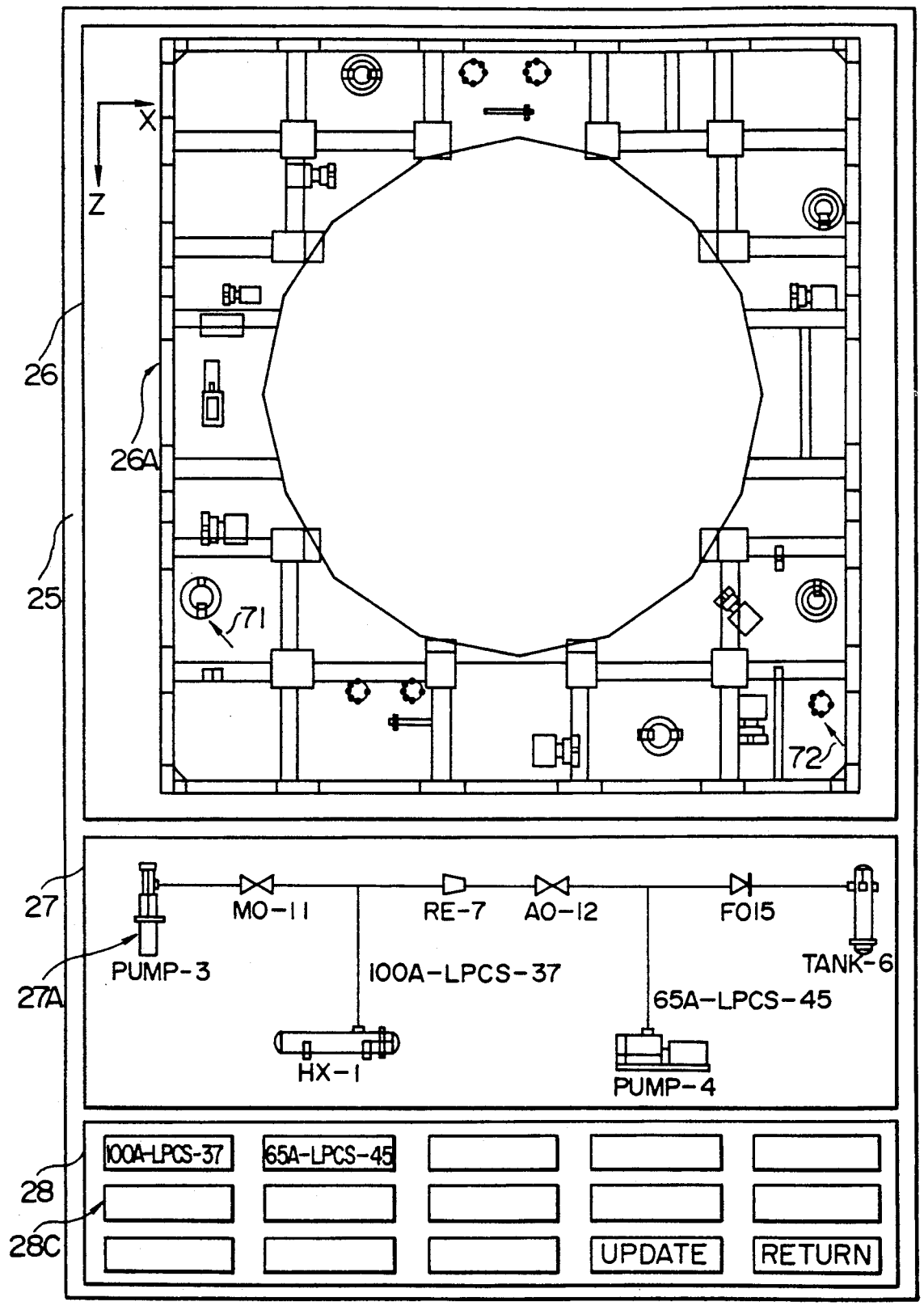
FIG. 22 shows an image displayed on the display device at the end of the step 13.

The image shown in FIG. 22 is displayed on the display device (by the image display controller 2 by supplying to the image data memory 3 the data stored in the intermediate data memory 5k through the steps 13A–13H.

Figure 23:
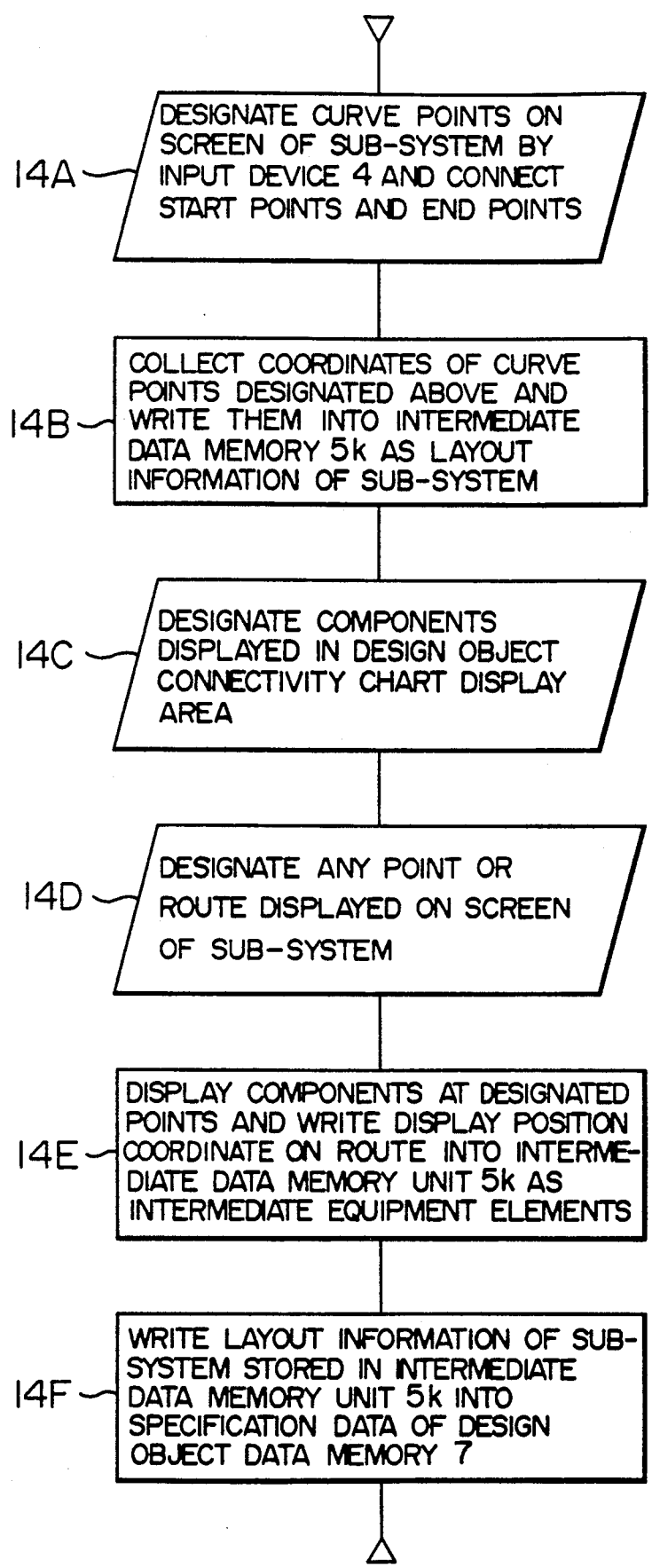
FIG. 23 shows the details of a flowchart of a step 14 of FIG. 9.
Figure 24:
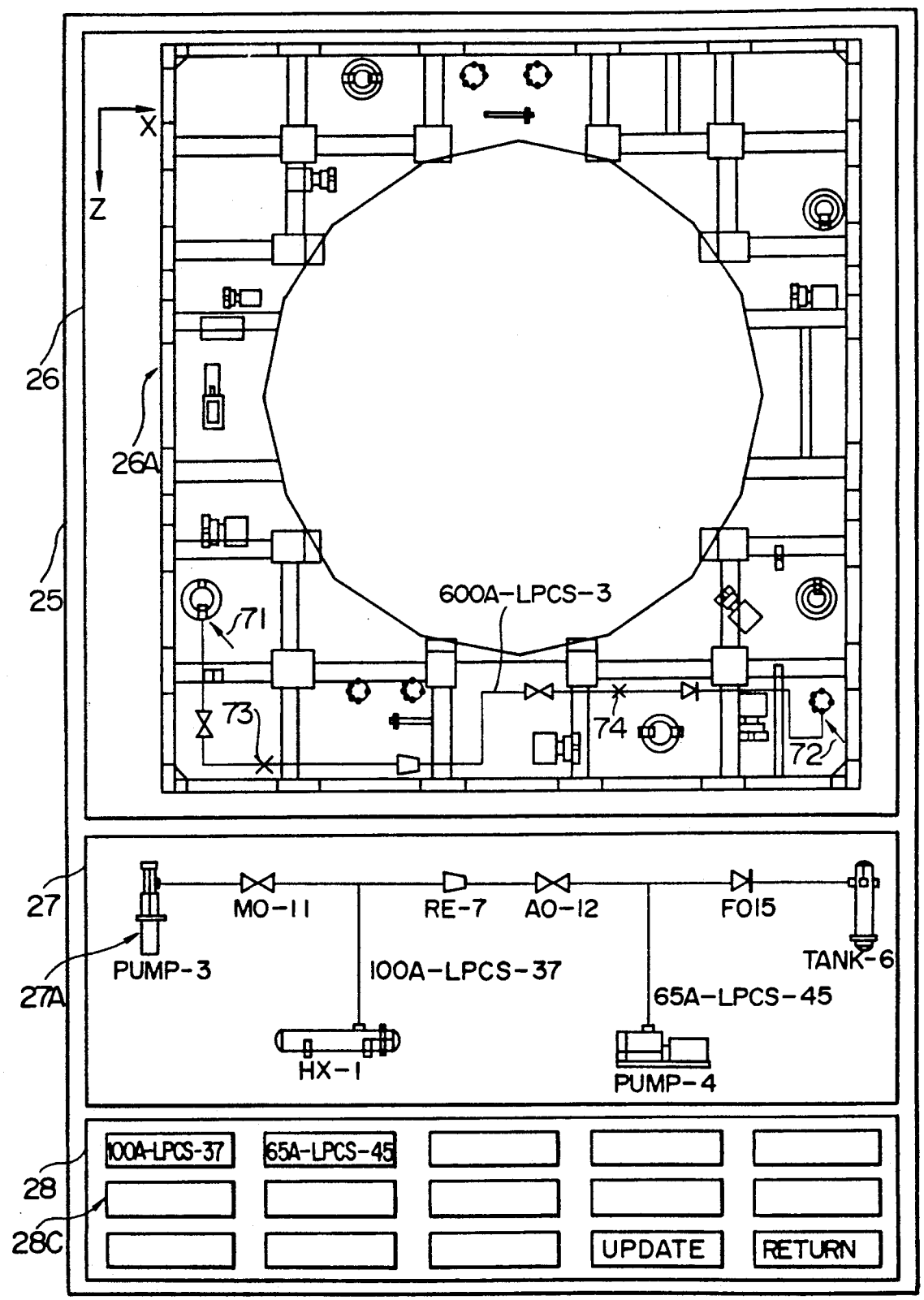
FIG. 24 shows an image displayed on the display device at the end of the step 14.

In a step 13I, the name of the sub-system stored in the intermediate data memory unit 5k is sent to the design object data memory 7 through the retrieval code output unit 5g, and the specification data of the sub-system is retrieved and the coordinates of the start point and the end point are red into through the data input unit 5h, and they are written into the intermediate data memory unit 5k together with index shape data for displaying the start point and the end point on the display screen. In a step 13J, the start pint and end point data and the index shape data stored in the intermediate data memory unit 5k are supplied to the image data memory 3. Indices (arrows) 71 and 72 are displayed at the coordinates of the start point and the end point of the sub-system '600A-LPCS-3" (FIG. 22). p FIG. 23 show the details of step 14. In a step 14A, curve points of indices 71 and 72 displayed on the screen 25 are designated by the input device 4 for the layout. The coordinates of the curve points are stored in the intermediate data memory 5k as layout information (step 14B). In steps 14C-14E, in order to determine locations of the components, that is, the components of the sub-system "600A-LPCS-3", the components of the sub-system in the image 27A displayed in the design object connection chart display area 27 are designated (step 14C), and a point on a route (displayed on the screen 25 after the step 15B) of the sub-system displayed in the design attachment display area 26 is designated (step 14D), and the display position coordinate and the shape data are written into the intermediate data memory unit 5k as component position information. The data stored in the intermediate data memory unit 5k in the step 14A-14E are supplied to the image data memory 3 and displayed on the display device 1. FIG. 24 shows the image displayed on the display device 1. In FIG. 24, numeral 73 denotes a branch point of "100A-LPCS-37" and numeral 74 denotes a branch point of "65A-LPCS-45". If the item "RETURN" in the menu display area 28 on the screen 25 is designated, the following step is terminated and the status prior to the step 12 is assumed and the image shown in FIG. 17 is displayed on the display device 1.

After the step 14E, a step 14F is carried out. The layout information of the sub-system (for example, 600A-LPCS'3) stored in the intermediate data memory 5k is written into the specification data of the design object of the design object data memory 7. Accordingly, the registered layout of the design object is displayed in the design object display area 26, and the branch lines "100A-LPCS-37" and "65A-LPCS-45" are laid out in the image 26A in the same manner as that for the sub-system.

When the step 12 and the subsequent steps are completed for all sub-systems (all sub-systems displayed in the menu display area 28 of FIG. 17) of one system (for example, LPCS), the step 10 and the subsequent steps are carried out for other systems (other than LPCS) displayed in the menu display area 28 in FIG. 12. When the step 10 and the subsequent steps have been carried out for all systems, the decision in the step 10A is "NO" and the layout in one design object area is completed. When the layout in the other design object area is necessary, the process is restarted from the step 9.

In the steps 9-14, since the connection of the components of the design object is displayed as the image, the design object can be easily arranged in the design object area. Since the connection of the design attachment and the components of the design object is displayed as the image, the arrangement of the design object can be very efficiently done.

When operator designs an overall layout, a design drawing is displayed on the screen 25 of the display device 1 to show it to the operator, and a chart showing connection of the design object is also displayed on the screen of the display device. Accordingly, the components an be arranged without error. Since the connection ,rom the upstream to the down stream such as system, sub-system, first branch lien and second branch line is orderly and systematically defined, even if a layout of a design object having a complex connection (branch) is to be designed, the layout may be designed starting from the upstream (main flow) or main section and a chart representing the connection of the downstream (branch flow) or minor section may be sequentially prepared. Accordingly, mismatching of connection specification by the operator is prevented and the layout work is efficiently carried out.

Since the menu of the system names and the sub-system names is also displayed on the display device 1, all related systems can be laid out.

Since the image of the layout of the design object and the image of the connection of the components of the design object are displayed on the design object area, the operator can easily check the design object lay out in the design object area while he/she watches the connection image.

Figure 9:
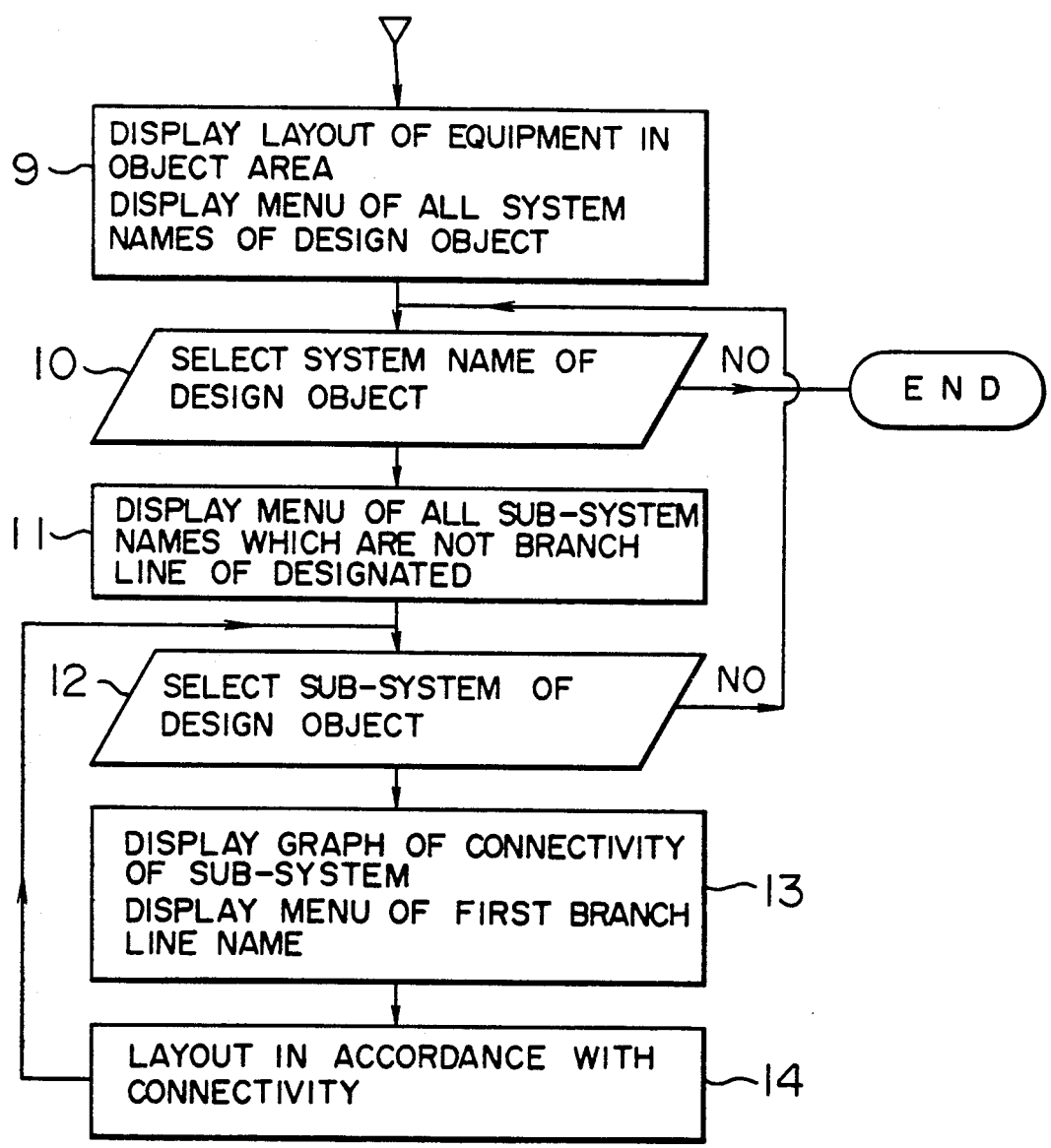

Instead of the steps 9-14 of FIG. 9, the steps 11-24 shown in FIG. 7 of Japanese Patent Application 60-53764 (corresponding U.S. Ser. No. 838,957 filed on Mar. 12, 1986) may be carried out to lay out the design object.

After the step 14 of the FIG. 9, the procedure shown in FIG. 10 is fetched to the processing unit 5a and steps 15-21 are sequentially carried out.

Figure 25:
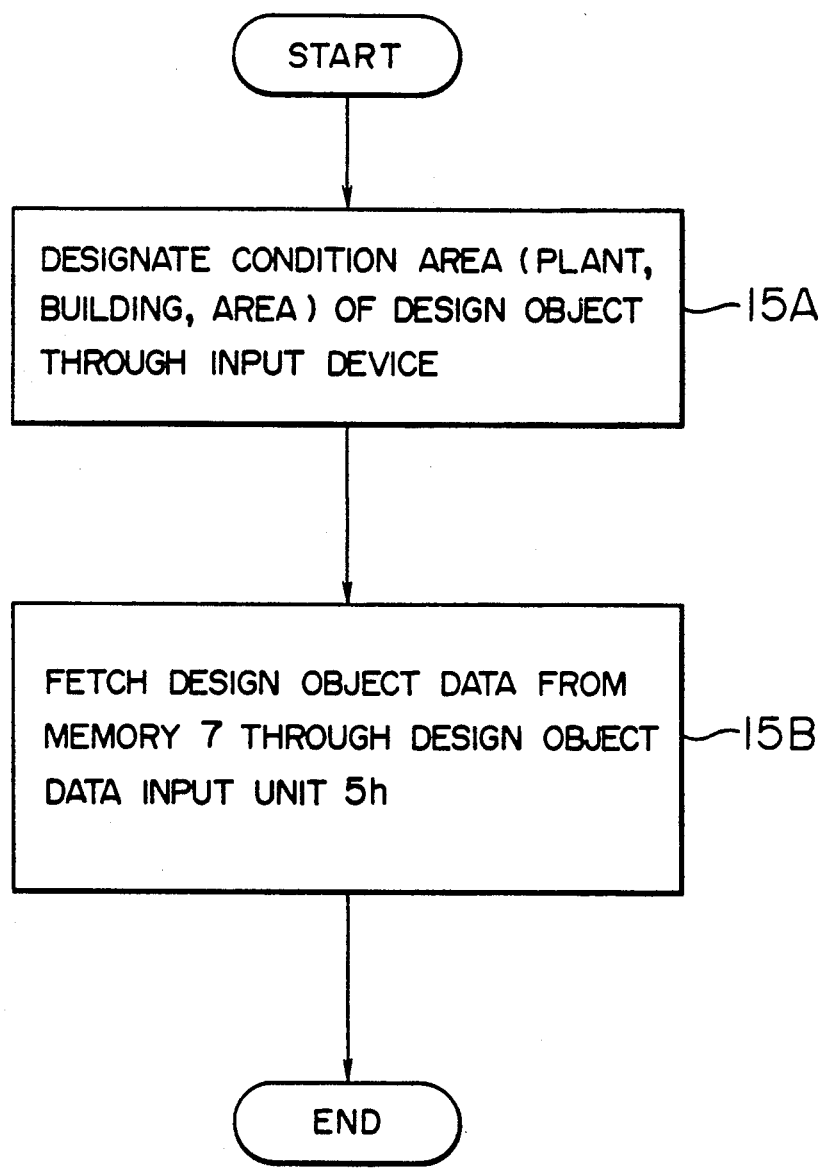
FIG. 25 shows the details of a flowchart of a step 15 of FIG. 10.

In a step 15, steps 15A and 15B shown in FIG. 25 are carried out. After the step 14, the code of the design object is entered by the operator through the input device 4 (step 15A). In accordance with the entered design object code, the processing unit 5a retrieves the layout information of the design object (stored in the step 14F) by the design object data memory 7 and the display data (data of the image 26A of FIG. 12) of the design attachment in the design object area in which the design object is arranged, by the design object data memory 6, and stores the retrieved data into the intermediate data memory unit 5k (step 15B).

Figure 26:
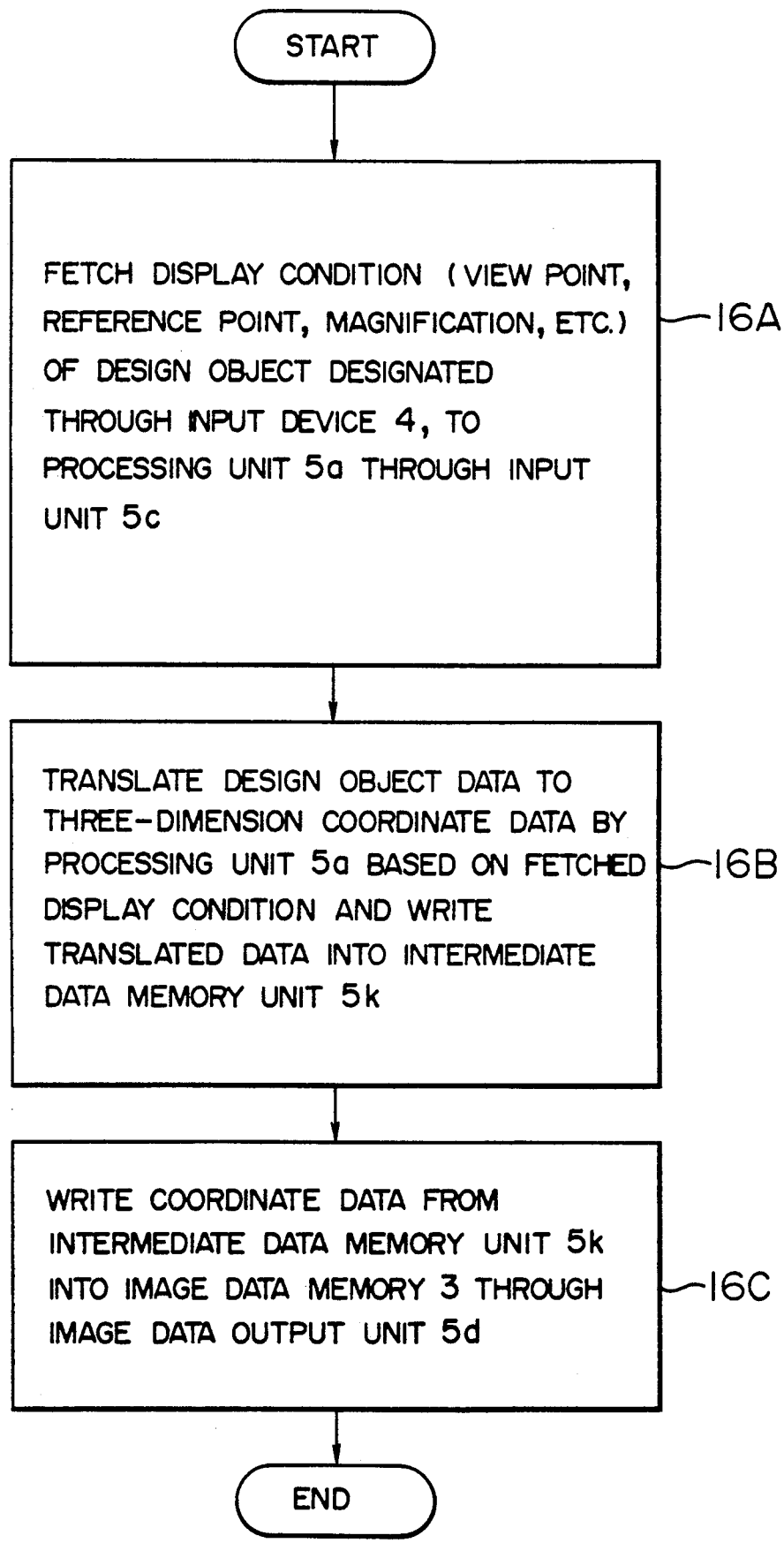
FIG. 26 shows the details of a flowchart of a step 16 of FIG. 10.
Figures 27, 28:
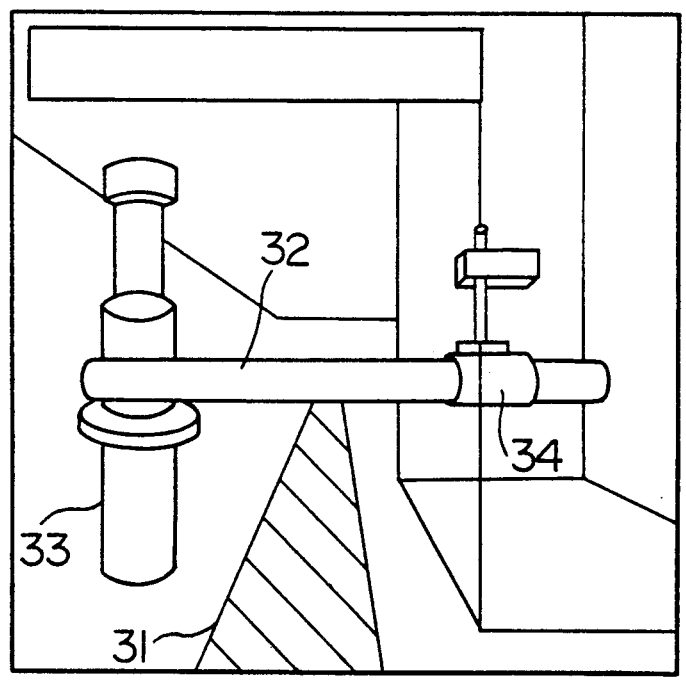
FIG. 27 shows a display condition entered at a step 16A.
FIG. 28 shows an image displayed on a display device based on data of a step 16D.

A step 16 following the step 15 comprises steps 16A-16C shown in FIG. 26. In a step 16A, a display condition (view point, reference point, magnification, etc.) of the design object inputted by the operator through the input device 4 is supplied to the processing unit 5a through the input unit 5c. FIG. 27 shows the display condition read in the step 16A. In a step 16B, the display data of the design attachment stored in the intermediate data memory unit 5k and the layout data of the design object (including shape data of the components of the design object and the pipes) are translated to three-dimension coordinate data in accordance with the input display condition and the translated data are stored in the intermediate data memory unit 5k. The coordinates (X, Y, Z) of the layout data of the design object and the display data of the design attachment are translated to the coordinates (X', Y', X') of the three-dimension coordinate data in accordance with the following formula.

$$(X', Y', Z', 1) = (X, Y, Z, 1) \begin{bmatrix} a_{11} & a_{21} & a_{31} & 0 \\ a_{12} & a_{22} & a_{32} & 0 \\ a_{13} & a_{23} & a_{33} & 0 \\ a_{14} & a_{24} & a_{34} & 1 \end{bmatrix} \quad (3)$$

where $a_{11}$-$a_{13}$, $a_{21}$-$a_{23}$ and $a_{31}$-$a_{33}$ are terms relating to rotation, expansion and reduction, and $a_{14}$, $a_{24}$, $a_{34}$ are terms relating to parallel shift. The translated three-dimension coordinate data (X', Y', Z') of the design object are written into the image data memory 3 through the image data output unit 5d (step 16C). The image display controller 2 fetches the coordinate data (X', Y', Z') from the image data memory 3 as the image data and displays it on the display device 1. Numeral 32 denotes a pipe for a line 002 of a system "LPCS", numeral 33 denotes a pump, numeral 34 denotes a value and numeral 31 denotes a footway.

Figure 29:
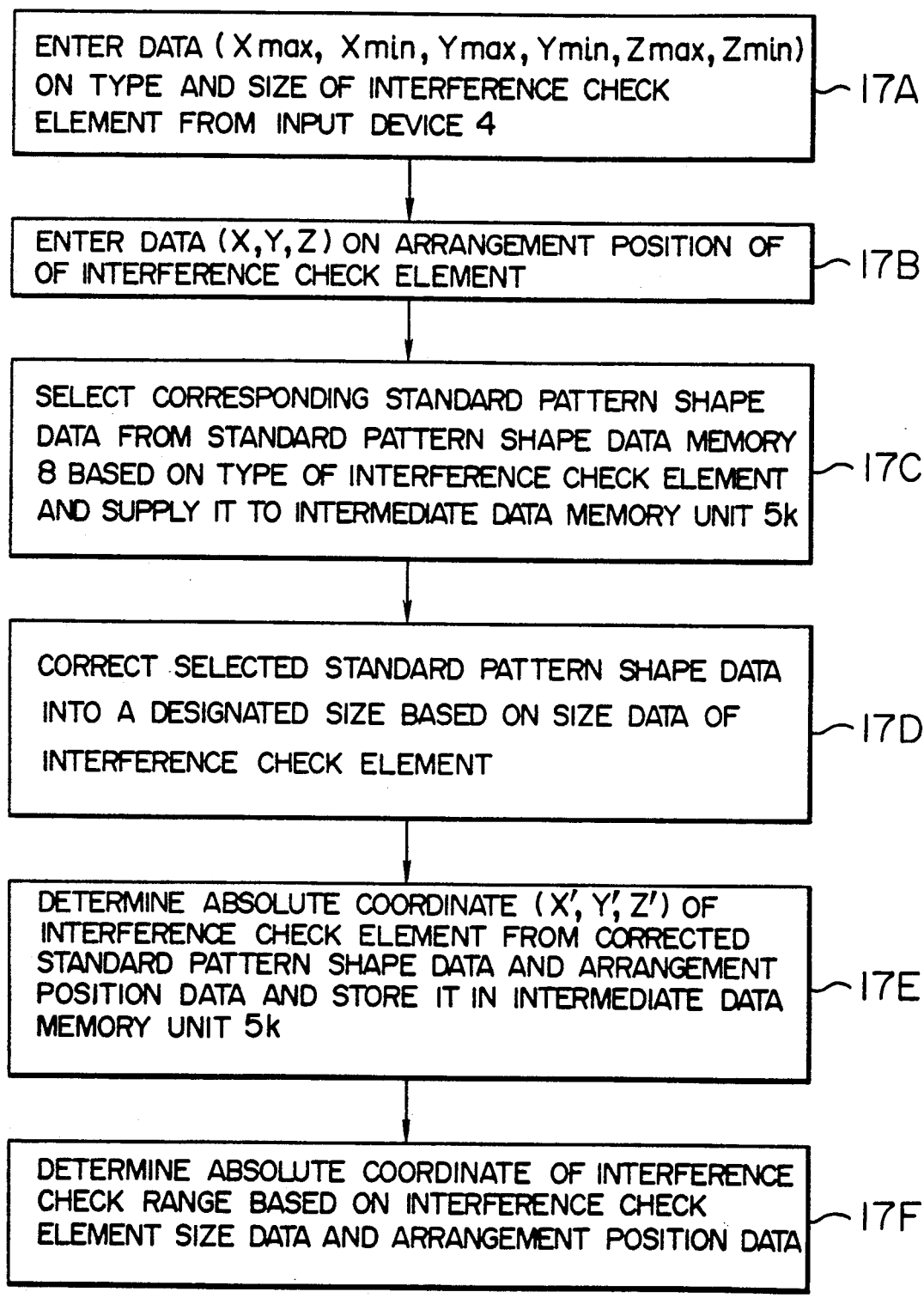
FIG. 29 shows the details of a flowchart of a step 17 of FIG. 10.
Figure 30:
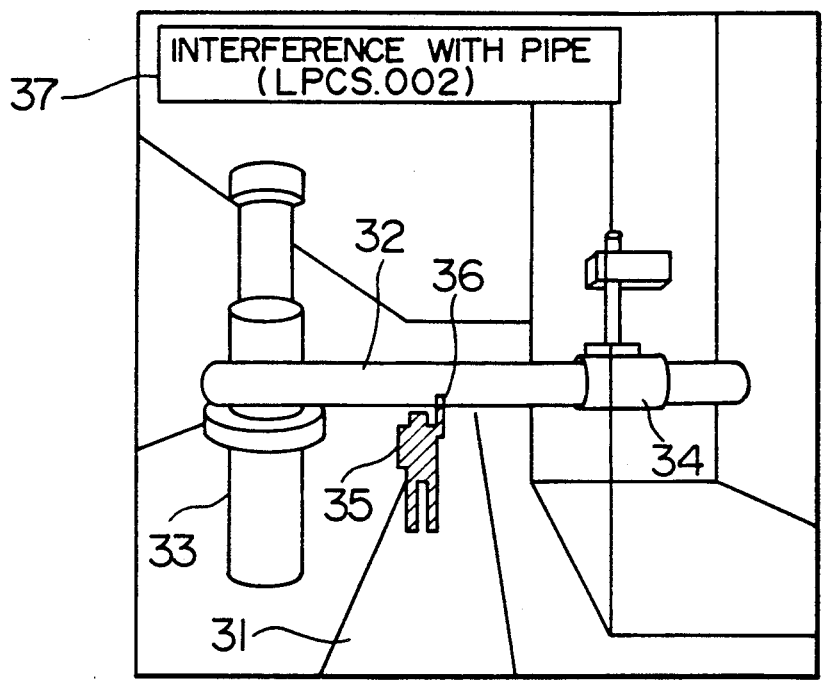
FIG. 30 shows an image displayed on a display device based on data in the step 17 of FIG. 29 and steps 20A and 20D in FIG. 33.

In a step 17, an interference check element is selected and an absolute coordinate (X', Y', Z') of a shape of the interference check element is determined. FIG. 29 shows a detail of the step 17. The operator enters a type of the interference check element and data of size of the interference check element (Xmax, Xmin, Ymax, Ymin, Zmax, Zmin) through the input device 4 (step 17A). In the present embodiment, the type of the interference check element includes imitation of human being, equipment and pipe to be transported in or out, transport apparatus, equipment to be disassembled and checked, manufacturing apparatus, and check device. The manufacturing apparatus may be an automatic welding apparatus used for installation or repair work, and the check device may be an ultrasonic fault locating device or a moving check device. In a step 17A, the imitation of human being is entered as the interference check element. The operator enters the position data (X, Y, Z) of the interference check element through the input device 4 (step 17B). The position of the interference check element is designated by the operator while he/she watches the image of FIG. 28. The arrangement of the imitation of the human being as the interference check element in a path 31 of FIG. 28 designates a coordinate of the path 31. In a step 17C, a standard pattern shape data of the corresponding interference check element is selected from the standard pattern shape data memory 8 in accordance with the type of the interference check element and the selected data is supplied to the intermediate data memory unit 5k. The selected standard pattern shape data is corrected based on the data of the size of the interference check element so that it has the size designated by the operator (step 17D). Then, in a step 17E, the absolute coordinate (X', Y', Z') of the shape data of the interference check element is determined and supplied to the image data memory 3 from the intermediate data memory unit 5k and the image data output unit 5d. The imitation of a human being as the interference check element is displayed in the path 31 on the screen of the display device 1 as if there were an actual human being (FIG. 30). In FIG. 30, numeral 35 denotes the imitation of human being. In a step 17F, the absolute coordinate (X'max, X'min, Y'max, Y'min, Z'max, Z'min) of the interference check range is determined based on the size data and position data of the interference check element and it is supplied to the intermediate data memory unit 5k. The absolute coordinate of the interference check range is determined by the following formulas.

$$\begin{rcases} X'\text{max} = X\text{max} + X \\ X'\text{min} = X\text{min} + X \\ Y'\text{max} = Y\text{max} + Y \\ Y'\text{min} = Y\text{min} + Y \\ Z'\text{max} = Z\text{max} + Z \\ Z'\text{min} = Z\text{min} + Z \end{rcases} \quad (4)$$

Figure 31:
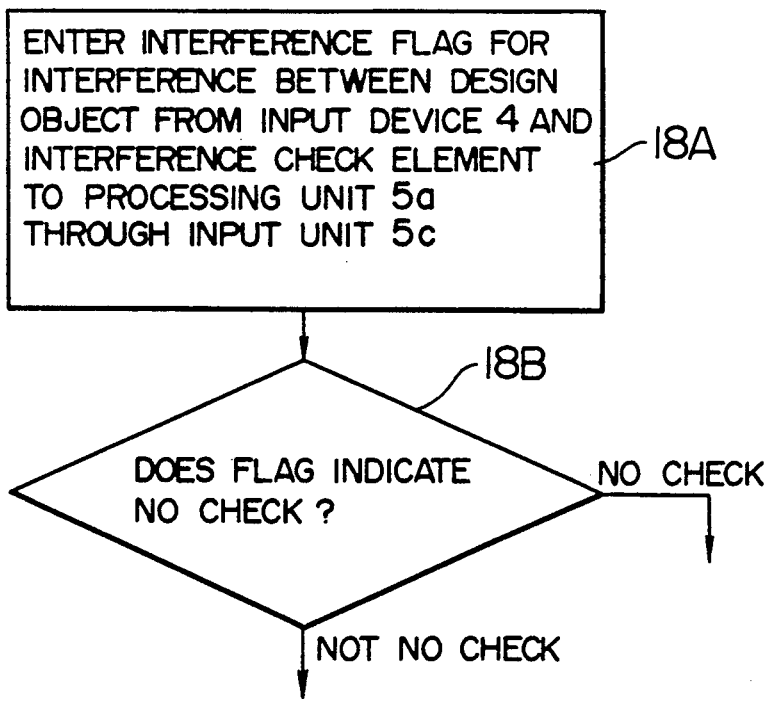
FIG. 31 shows the details of a flowchart of a step 18 of FIG. 10.

In a step 18, whether the check of interference between the design object and the interference check element is necessary or not is designated. The operator designates the requirement or non-requirement of the interference check through the input device 4. In a step 18A of FIG. 31, an interference check flag supplied from the input device 4 is supplied to the processing unit 5a through the input unit 5c. The processing unit 5a determines whether the input flag indicates the necessity of the interference check or not (step 18B). If the interference check is not necessary in the step 18B, the process returns to the step 16 and another design object entered in the step 15A is displayed and the subsequent steps are carried out. If the interference check is necessary in the step 18B, a step 19 is carried out.

Figure 32:
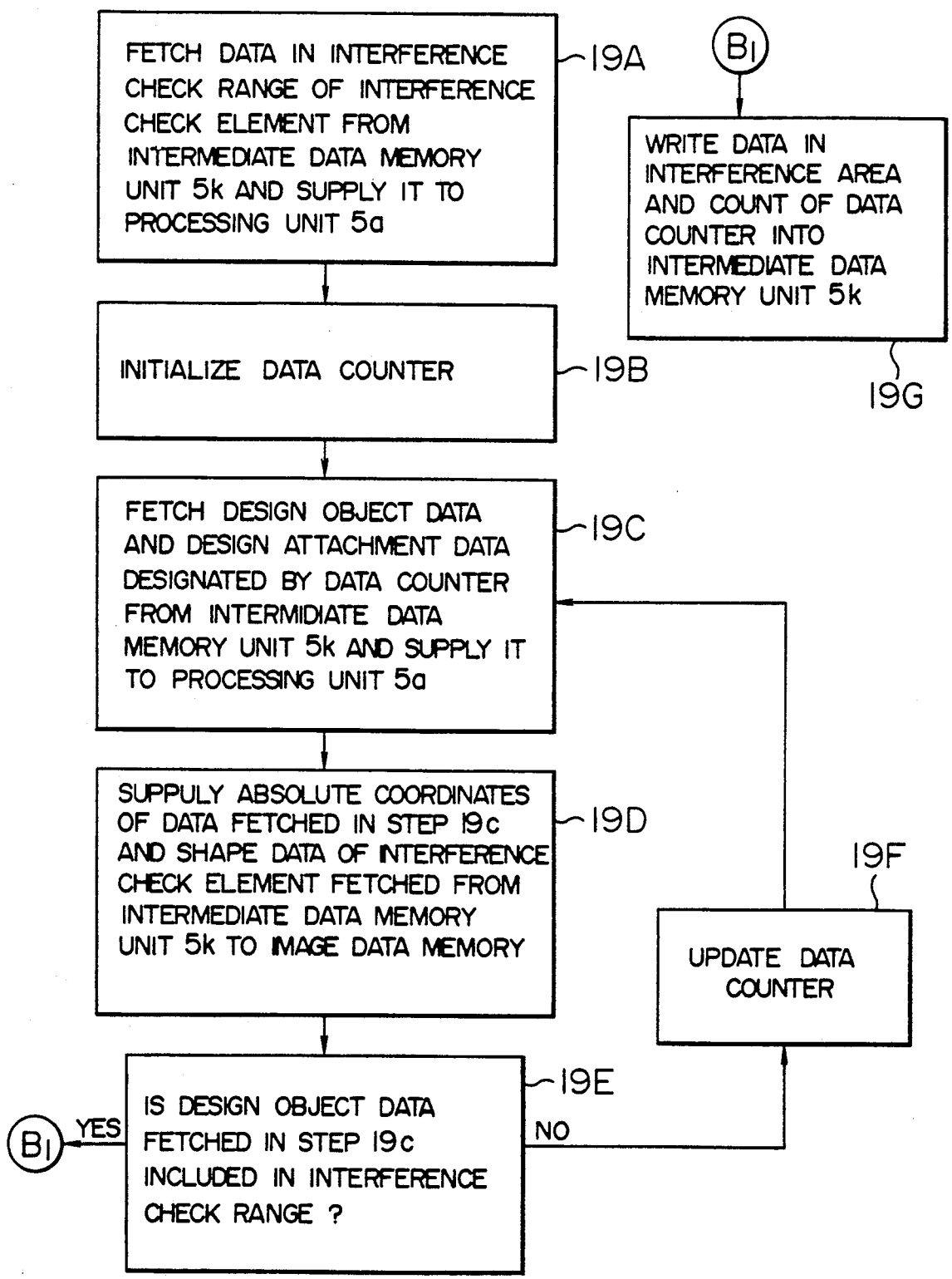
FIG. 32 shows the details of a flowchart of a step 19 of FIG. 10.

The step 19 is now explained. FIG. 32 shows a detail of the step 19. In a step 19A, the absolute coordinate of the interference check range determined in the step 17E is fetched from the intermediate data memory unit 5k into the processing unit 5a. In a step 19B, a data counter which is related under a certain condition with the design object data number of the components of the design object and the pipes which are to be checked for the interference with the interference check element designated by the input signal in the step 17A, is initialized by the processing unit 5a. The design object data number and the data counter may have one-to-one correspondence. When the design object data number and the data counter have one-to-one correspondence, the design object data counter can be set to "1" in the step 19B. In a step 19C, the design object data designated by the data counter (design object data of the area including the components and pipes for which interference with the interference check element is to be checked) and the design object data of the area in which the components designated by the design object data are arranged are fetched from the intermediate data memory unit 5k and supplied to the processing unit 5a. The fetched design object data and design attachment data have been translated to the three-dimensional absolute coordinate data in the step 16C. In a step 19D, the absolute coordinates of the design object data and the design attachment data fetched in the step 19C and the shape data of the interference check element fetched from the intermediate data memory unit 5k (which are stored in the intermediate data memory unit 5k in the step 17E) are supplied to the image data memory 3 through the image data output unit 5d. The design object data, design attachment data and shape data are displayed on the display device 1. The displayed image is shown in FIG. 30. Numeral 35 denotes the imitation of human being. In a step 19E, whether the absolute coordinate (X', Y', Z') of the design object data fetched in the step 19C or line segments connecting certain absolute coordinates (line segments outlining the surface of the design object) interfere with the interference check range or not is checked. The check is done in the following manner. As to the absolute coordinate (X', Y', Z') of the design object data, the design object data is included in the interference check range, that is, the corresponding design object interferes with the interference check element when the following conditions are met.

$$X'\text{min} \leq X' \leq X'\text{max} \\ Y'\text{min} \leq Y' \leq Y'\text{max} \\ X'\text{min} \leq Z' \leq Z'\text{max} \}$$ (5)

As to the line segments connecting certain design object data, when an absolute coordinate $(X_1', Y_1', Z_1')$ of one end point of the line segment satisfies the three conditions of the item (a) described below, or when the line segment has a crosspoint with any one of planes 1–6 shown in the item (b), the line segment is included in the interference check range, that is, the corresponding design object interferes with the interference check element.

(a) The end point of the line segment is within the range of the following three conditions.

$$X'min \leq X_1' \leq X'max$$

$$Y'min \leq Y_1' \leq Y'max$$

$$Z'min \leq Z_1' \leq Z'max$$

(b) The line segment crosses with one of the planes 1–6.
Plane 1 defined by connecting;
point (X'max, Y'max, Z'max)
point (X'min, Y'max, Z'max)
point (X'min, Y'min, Z'max)
point (X'max, Y'min, Z'max):
Plane 2 defined by connecting;
point (X'max, Y'max, Z'min)
point (X'max, Y'max, Z'max)
point (X'max, Y'min, Z'max)
point (X'max, Y'min, Z'min):
Plane 3 defined by connecting;
point (X'min, Y'max, Z'min)
point (X'max, Y'max, Z'min)
point (X'max, Y'min, Z'min)
point (X'min, Y'min, Z'min):
Plane 4 defined by connecting;
point (X'min, Y'max, Z'max)
point (X'min, Y'max, Z'min)
point (X'min, Y'min, Z'min)
point (X'min, Y'min, Z'max):
Plane 5 defined by connecting;
point (X'min, Y'max, Z'min)
point (X'min, Y'max, Z'max)
point (X'max, Y'max, Z'max)
point (X'max, Y'max, Z'min):
Plane 6 defined by connecting;
point (X'min, Y'min, Z'max)
point (X'min, Y'min, Z'min)
point (X'max, Y'min, Z'min)
point (X'max, Y'min, Z'max).

If it is determined in the step 19E that a portion or all of the components (or pipes) of the design object fetched in the step 19C are not included in the interference check range, a step 19F is carried out. In the step 19F, the count of the data counter is updated to the next count. After the data counter has been updated, the process returns to the step 19C and the design object data corresponding to the count of the updated data counter and the design attachment data corresponding to the design object data are fetched from the intermediate data memory unit 5k. In the step 19D, the design object and the design object data are supplied to the image data memory 3 and the components based on the design object and design attachment data are displayed on the display device 1. The X-Y or two-axis coordinate of the image of the components shifts from that of the image displayed before the data counter is updated. As a result, the image of the components displayed on the display device 1 based on the design object outputted in the step 19D after the updating of the data counter appears moving. For example, the backside of the path 31 moves forward. Thus, it appears as if the imitation 35 of the human being walks on the path 31. In a step 19F, if the data counter is updated, the coordinate of the arrangement position of the interference check element is also changed in the step 19D. The change is in the opposite direction to the change of the coordinates of the components of the design object and absolute values of changes are equal. Based on the updated coordinate of the arrangement position of the interference check element, the shape data of the interference check element and the absolute coordinate of the interference check range are determined in a manner similar to the steps 17E and 17F. The absolute coordinate of the new shape data is supplied to the image data memory 3 in the step 19D and displayed on the display device 1. Since the absolute values of the changes are equal as described above, the interference check element is displayed on the screen of the display device 1 at the same point as that prior to the updating of the data counter. However, since the image of the components moves as described above, it appears as, if the interference check element (the imitation 35 of the human being in the present embodiment) advances along the path 31. In the next step 19E, the interference between the updated interference check range and the components of the design object is checked. If the interference does not exist, the step 19F and the steps 19C–19E after the updating are again carried out. In the step 19E, if the interference between the components of the design object and the interference check range is detected, a step 19G is carried out. In the step 19G, the area of the components of the design object which interfere with the interference check range is determined and the data of the interference area is stored in the intermediate data memory unit 5k, and the count of the data counter which has caused the interference is stored in the intermediate data memory unit 5k. Thus, the step 19 is terminated.

Even after the step 19G, if the interference check element is movable or if the path 31 along which the imitation 35 of the human being still exists, the steps 19F, 19C, 19D and 19E may be repeatedly carried out. When the interference check area by the imitation 35 of the human being no longer exists, a step 20 is carried out.

In the step 20, the interference check result are displayed as shown in FIG. 33. In the step 20, the data of the interference area stored in the intermediate data memory unit 5k is fetched and red display data is added to the interference area data and it is supplied to the image data memory 3 through the image data output unit 5d. Thus, the interference area is displayed in red on the screen of the display device 1. An area 36 in FIG. 30 is displayed in red indicating the interference. In a step 20B, the count of the counter stored in the intermediate data memory unit 5k in the step 19G is fetched, and based on the fetched count, the type of the design object, the system name of the design object and the data number are retrieved (step 20C). Based on the data retrieved in the step 20C, a display character string is prepared and supplied to the image data memory 3 through the image data output unit 5d (step 20D). The character string is displayed on the display device 1 as the image 37 (FIG. 30).

When the interference check by one interference check element is completed at the end of the step 20, the operator determines whether the interference check by another check element is required or not and it is entered by the input device 4. This signal is supplied to the processing unit 5a and a step 21 is carried out. If the processing unit 5a determines that the check by another interference check element is required, the steps 17–20 are carried out for the new interference check element. The step 21 may be automatically carried out without designation by the operator. In this case, a procedure for detecting the interference check elements for which the interference check has been completed and the interference check elements which require the interference check and carrying out the interference check sequentially to the remaining interference check element may be incorporated and the process is carried out in accordance with the procedure. If the check by another interference check element is not required, the process ends (step 22). If the interference check is to be carried out to a new design object (for example, another system), the process is carried out again from the step 15.

Figure 35:
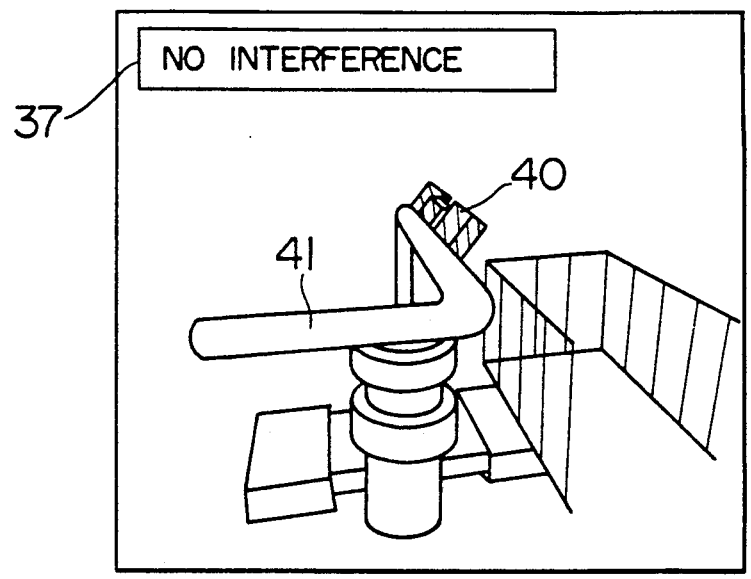
Figure 36:
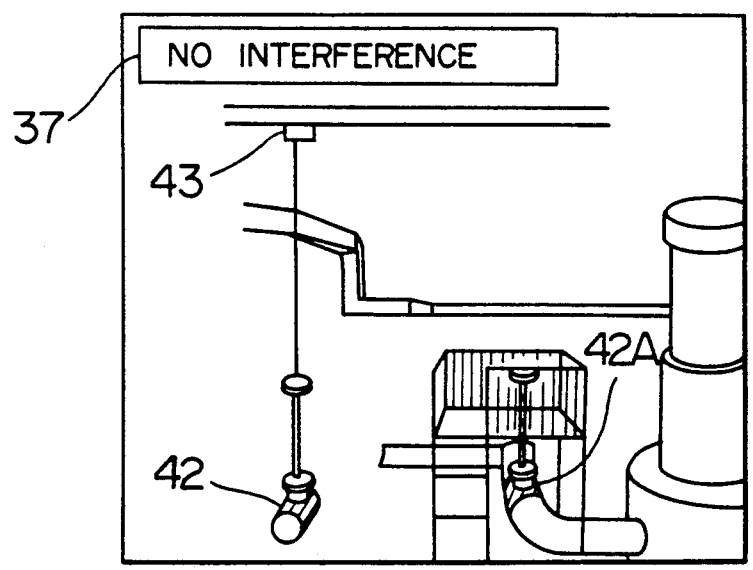

In the present embodiment, it is necessary to conduct the interference check for the equipment to be transported in and out, the check devices and the equipment to be checked. Thus, the steps 15 - 21 are sequentially carried out as the operator enters the equipment to be transported in and out (pump in the present embodiment), check devices (ultrasonic fault location device in the present embodiment) and the equipment to be checked (value in the present embodiment). FIGS. 34 to 36 show images of the interference check results displayed on the display device 1. FIG. 34 shows an image displayed when a pump 38 is transported in by a whist 39. Since there is no interference between the moving pump 38 which is the interference check element and the components of the design object, "NO INTERFERENCE" is displayed on the display device 1. Thus, it can be easily confirmed in a design stage or prior stage that a sufficient path for transporting in and out the equipment is assured. In FIG. 35, a pipe 41 is fault-located by an ultrasonic fault location device (interference check element) 40. Again, "NO INTERFERENCE" is displayed because there is no interference. Thus, it can be easily confirmed in the design stage of the design object that the ultrasonic fault location can be carried out without interference with other pipes and equipments even if the ultrasonic fault location device 40 mounted on the pipe 41 is moved around the pipe 41 for checking. FIG. 36 shows an image displayed when a valve 42 (interference check element) to be checked is hung by the whist 43 and removed from the pipe. Numeral 42A denotes a portion to which the valve 42 is to be attached. The portion 42A is displayed in white to indicate a detached status. Again, "NO INTERFERENCE" is displayed and it is confirmed that sufficient space for moving the removed valve 42 is assured.

The process to be carried out when "INTERFERENCE" is detected in the step 19E is explained for the case of FIG. 30. After the step 22, information relating to the system chart (for example, the image 26A of FIG. 24) of the design object shown in FIG. 30 which includes an interference area is fetched from the design object data memory 7 and supplied to the intermediate data memory unit 5k to display the system chart on the display device. Then, curve points designated by the input device 4 to eliminate the interference area and the steps 14A–14F are carried out. For the corrected design object arrangement, the steps 15–20 in which the imitation 35 of a human being is used as the interference check element are carried out again. Through steps 15–20, any obstacle which a man may encounter when he walks along the path in the design object area (or walks up or down a step) can be checked, and if there is an obstacle, a design correction can be made to eliminate the obstacle. Such a correction may also be applied when "INTERFERENCE" is detected in FIGS. 34–36.

In the present embodiment, the interference between the interference check element which imitates the article or human being moving in the design object area and the components of the design object can be readily checked in the design stage by the simulation in the steps 15–20 while the components of the design object are arranged. Since the interference can be checked by the simulation while the interference check element and the design object are displayed on the display device 1 such that the interference check element relatively moves, the interference with the moving article (or human being) in a state in which the design object is actually installed can be efficiently checked.

In the embodiments for producing the images of FIGS. 30 and 34–36, the interference check element corresponds to the article or human being moving in a predetermined space in the design object area in which the design object is arranged. If there is an interference, the interference area is displayed so that the interference area can be readily detected. Rearrangement of the components of the design object to eliminate the interference area can also be readily made. Accordingly, a moving space of the movable article after the installation of the design object can be readily set in the design state.

The above embodiments are applied to the equipments and pipes of a nuclear plant although they may be applied to the arrangement of the components in other plant or apparatus.

The data counter used in the step 19B is a procedure having a counter function, and the procedure is stored in the process memory unit 5b. The procedure of the data counter is fetched when the step 19B is carried out.

In accordance with the present invention, the interference between the movable article which moves in the area in which the component of the design object are arranged and the components of the design object is checked by simulation so that any interference can be readily detected in the design stage.

We claim:

1. A method for making a design reference for use in a design support apparatus including input means, a display device, a memory device and a processor connected to said input means, said display device and said memory device for performing design support operations, said method comprising the steps of:

selecting, by said processor, data corresponding to a design object designated by said input means from data stored in said memory device;

preparing, by said processor, first information for graphically displaying a structure of said designated design object by using said selected data;

preparing, by said processor, second information for graphically displaying an interference check element which imitates a shape of an article or a human, said interference check element being movable in an area in which said designated design object is to be arranged;

displaying graphically, by said processor, on a display device said designated design object and said interference check element by using said first information and said second information;

detecting, by said processor, an interference between said interference check element and said designated design object by moving said interference check element relative to said designated design object and displaying graphically said movement; and displaying, by said processor, third information on said display device wherein said third information indicates said detected interference.

2. A method for making a design reference according to claim 1 wherein said interference between said interference check element and said designated design object is detected by detecting points of interference occurring between said interference check element and said design object when said interference check element is moved.

3. A method for making a design reference for use in a design support apparatus including input means, a display device, a memory device and a processor connected to said input means, said display device and said memory device for performing design support operations, said method comprising the steps of:

selecting, by a said processor, data corresponding to a design object designated by said input means from data stored in said memory device;

preparing, by said processor, first information for graphically displaying a structure of said designated design object by using said selected data;

preparing, by said processor, second information for graphically displaying an interference check element which imitates a shape of an article or a human, said interference check element being movable in an area in which said designated design object is to be arranged;

displaying graphically, by said processor, on a display device said designated design object and said interference check element by using said first information and said second information;

detecting, by said processor, an interference between said interference check element and said designated design object;

displaying, by said processor, third information on said display device wherein said third information indicates said detected interference;

wherein an interference between said interference check element and said designated design object is detected by said processor when said interference check element is moved relative to said designated design object such that said interference check element appears to move along said predetermined moving area and points of interference occurring between said interference check element and said designated design object are detected during the moving of said interference check element.

4. A method for making a design reference for use in a design support apparatus including input means, a display device, a memory device and a processor connected to said input means, said display device and said memory device for performing design support operations, said method comprising the steps of:

selecting, by a said processor, data corresponding to a design object designated by said input means from data stored in said memory device;

preparing, by said processor, first information for graphically displaying a structure of said designated design object by using said selected data;

preparing, by said processor, second information for graphically displaying an interference check element which imitates a shape of an article or a human, said interference check element being movable in an area in which said designated design object is to be arranged;

displaying graphically, by said processor, on a display device said designated design object and said interference check element by using said first information and said second information;

detecting, by said processor, an interference between said interference check element and said designated design object;

displaying, by said processor, third information on said display device wherein said third information indicates said detected information;

preparing, by said processor, graphic information of said interference check element and said designated design object related to the relative movement between said interference check element and said design object; and displaying graphically on said display device by said processor the relative movement between said interference check element and said design object by using said graphic information, said relative movement being performed such that said interference check element appears to move along a predetermined moving area.

5. A method for making a design reference according to claim 1 wherein an interference area for said interference check element and said designated design object is displayed on said display device.

6. A method for making a design reference according to claim 1 wherein a name of a component including said designated design object interfering with said interference check element is displayed on said display device.

7. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in an area in which said design object is arranged; and graphically displaying, by said processor, said interference check element using said third information and graphically displaying a movement of said interference check element relative to said design attachment and said design object to detect an interference between said interference check element and said design object or said design attachment.

8. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in an area in which said design object is arranged;

displaying graphically by said processor said interference check element using said third information;

detecting by said processor an interference between said interference check element and said design object by moving said interference check element relative to said design object and graphically displaying said movement; and displaying by said processor fourth information indicating the detected interference on said display device.

9. A method for making a design reference according to claim 8 wherein said interference between said interference check element and said design object is detected by detecting points of interference occuring between said interference check element and said design object when said interference check element is moved.

10. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designed by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in a predetermined moving area in which said design object is arranged;

displaying graphically by said processor said interference check element using said third information;

detecting by said processor an interference between said interference check element and said design object; and displaying by said processor fourth information indicating the detected interference on said display device;

wherein an interference between said interference check element and said design object is detected by said processor when said interference check element is moved relative to said design object such that said interference check element appears to move along said predetermined moving area and points of interference occurring between said interference check element and said design object are detected during the moving of said interference check element.

11. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being including in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in an area in which said design object is arranged;

displaying graphically by said processor said interference check element using said third information;

detecting by said processor an interference between said interference check element and said design object;

displaying by said processor fourth information indicating the detected interference on said display device;

preparing by said processor graphic information of said interference check element and said design object of a relative movement between said interference check element and said design object, said relative movement being performed such that said interference check element appears to move along said area; and displaying graphically on said display device by said processor the relative movement between said interference check element and said design object using said graphic information.

12. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in a predetermined moving area in which said design object is arranged;

displaying graphically, by said processor, said interference check element using said third information;

detecting by said processor an interference between said interference check element and said design object;

displaying by said processor fourth information indicating the detected interference on said display device;

preparing, by using said processor, graphic information of said interference check element and said design object of a relative movement between said interference check element and said design object, said relative movement being performed such that said interference check element appears to move along said predetermined moving area; and displaying graphically on said display device by said processor the relative movement between said interference check element and said design object using said graphic information.

13. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in an area in which said design object is arranged;

displaying graphically, by said processor, said interference check element using said third information;

detecting, by said processor, an interference between said interference check element and said design object by moving said interference check element relative to said design object and displaying graphically said movement; and displaying by said processor fourth information indicating the detected interference on said display device;

wherein an interference area for said interference check element and said design object is displayed on said display device.

14. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in an area in which said design object is arranged;

displaying graphically, by said processor, said interference check element using said third information;

detecting, by said processor, an interference between said interference check element and said design object by moving said interference check element relative to said design object and displaying graphically said movement; and displaying, by said processor, fourth information indicating the detected interference on said display device;

wherein a name of a component including said design object interfering with said interference check element is displayed on said display device.

15. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in an area in which said design object is arranged; and graphically displaying by said processor, said interference check element using said third information and graphically displaying a movement of said interference check element relative to said design attachment and said design object to detect an interference between said interference check element and said design attachment and said design object;

wherein a first menu related to a plurality of design objects arranged in said designated design object area and a second menu related to components to be connected to said design object are successively displayed on said display device.

16. A method for making a design reference for use in a design support apparatus including input means, a display device, a memory device and a processor connected to said input means, said display device and said memory device, for performing design support operations, said method comprising the steps of:

selecting, by said processor, data of a design attachment and a design object being included in a design object area designated by said input means from data stored in said memory device;

preparing, by said processor, first information for graphically displaying a structure of said design attachment by using the selected data of said design object;

preparing, by said processor, second information for graphically displaying structures of components included in said design object and status of coupled components by using the selected data of said design object;

displaying graphically, by said processor, on said display device the structure of said design attachment, the structures of the components included in said design object and the status of the coupled components using said first information and said second information;

preparing, by said processor, third information for graphically displaying an interference check element which imitates a shape of an article or a human, said interference check element being movable in an area in which said design object is arranged;

graphically displaying, by said processor, said interference check element using said third information and graphically displaying a movement of said interference check element relative to said design attachment and said design object to detect an interference between said interference check element and said design object;

displaying graphically by said processor the structure of the design attachment in a first region on said display device;

displaying graphically, by said processor, the structures of the components of the design object and the status of the coupled components in a second region on said display device; and displaying graphically the structures of the components and the status of the coupled components at a position designated by said input means in a figure of the design attachment displayed in the fist region on said display device.

17. An apparatus for making a design reference comprising:

an input device;

a first memory for storing design object data;

a second memory for storing steps of selecting from said first memory design object data for a design object designated by said input device, preparing first information for displaying said design object using the selected design object data, preparing second information for displaying an interference check element designated by said input device and moving said interference check element relative to said design object to detect an interference between said interference check element and said design object;

processing means connected to said input device and said first and second memory for selecting design object data designated by said input device, preparing said first information, preparing said second information and moving said interference check element relative to said design object to detect an interference between said interference check element and said design object in accordance with said steps stored in said second memory; and a displaying device connected to the processing means for displaying said first information, said second information and said moving of said interference check element relative to said design object as prepared and performed by said processing means.

18. An apparatus for making a design reference comprising:

an input device;

a first memory for storing design object data;

a second memory for storing steps of selected from said first memory design object data for a design object designated by said input device, preparing first information for displaying said design object based on the selected design object data, preparing second information for displaying an interference check element designated by said input device, detecting an interference between said design object and said interference check element by moving said interference check element relative to said design object, and preparing third information for displaying the detected interference;

processing means connected to said input device and said first and second memory for selecting design object data designated by said input device, preparing said first information, said second information, and said third information and detecting an interference by moving said interference check element relative to said design object in accordance with said steps stored in said second memory; and a display device connected to said processing means for displaying said first information, said second information, said third information and said moving of said interference check element relative to said design object as prepared and performed by said processing means.

19. An apparatus for making a design reference comprising:

a first input device for designating a design object area;

a second input device for designating a design object to be arranged in said design object area;

a first memory for storing design attachment data;

a second memory for storing design object data;

a third memory for storing steps of selecting from said first memory data of a design attachment to be arranged in said design object area designated by said first input device, preparing first information for graphically displaying a structure of design attachment based on said selected design attachment data, selecting from said second memory data of a design object designated by said second input means, preparing second information for graphically displaying structures of components including said designated design object and status of coupled components using said selected design object data, preparing third information for displaying a designated interference check element, detecting an interference between said designated design object and said designated interference check element by moving said designated interference check element relative to said designated object and, preparing fourth information for displaying said detected interference;

processing means connected to said first and second input devices and said first, second and third memories for selecting design attachment data and designated design object data, preparing said first information, said second information, said third information and said fourth information, moving said designated interference check element relative to said designated design object and detecting an interference between said designated design object and said designated interference check element in accordance with said steps stored in said third memory using said design object area designated by said input device and a design object designated by a second input device;

a display device connected to said processing means for displaying said first information, said second information, said third information and said fourth information and said moving of said interference check element relative to said designated design object as prepared and performed by said processing means.

20. An apparatus for making a design reference comprising:

an input device;

a processor connected to said input device for selecting design object data for a design object designated by said input device from design object data stored in a memory, preparing first information for displaying said design object using said selected design object data, preparing second information for displaying an interference check element designated by said input device and moving said interference check element relative to said design object to detect an interference between said interference which element and said design object; and a display device connected to said processor for displaying said first information, said second information and said moving of said interference check element relative to said design object as prepared and performed by said processor.

21. An apparatus for making a design reference comprising:

first means for selecting design object data for a designated design object from design object data stored in a memory;

second means, connected to said first means, for preparing first information for displaying said design object using said selected design object data;

third means, connected to said second means, for detecting an interference between a designated interference check element and said design object by moving said designated interference check element relative to said design object and preparing second information for displaying said movement and said detected interference; and fourth means, connected to said second mean sand said third means, for displaying said first information and said second information on a display device.

22. A method for making a design reference for use in a design support apparatus including input means, a display device, a memory device and a processor connected to said input means, said display device and said memory device for performing design support operations, said method comprising the steps of:

selecting, by a said processor, data corresponding to a design object designated by said input means from data stored in said memory device;

preparing, by said processor, first information for graphically displaying an interference check element which imitates a shape of an article or a human, said interference check element being movable in an area in which said designated design object is to be arranged;

displaying graphically, by said processor, on a display device said designated design object and said interference check element by using said first information and said second information;

detecting, by said processor, an interference between said interference check element and said designated design object;

displaying, by said processor, third information on said display device wherein said third information indicates said detected information;

correcting, by said processor, layout of a part of said design object at which interference occurs, by using data designated by said input means, when an interference is detected during a check by said processor; and preparing, by said processor, layout information for displaying graphically the structure of the corrected part of said design object.

* * * * *